(12) United States Patent
Osame

(10) Patent No.: US 7,589,708 B2
(45) Date of Patent: Sep. 15, 2009

(54) SHIFT REGISTER AND METHOD OF DRIVING THE SAME

(75) Inventor: Mitsuaki Osame, Atsugi (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 542 days.

(21) Appl. No.: 11/291,839

(22) Filed: Dec. 2, 2005

(65) Prior Publication Data

US 2006/0082535 A1    Apr. 20, 2006

Related U.S. Application Data

(62) Division of application No. 10/194,260, filed on Jul. 15, 2002, now Pat. No. 7,002,545.

(30) Foreign Application Priority Data

Jul. 16, 2001    (JP)    .............................. 2001-216040

(51) Int. Cl.
G09G 3/36    (2006.01)
(52) U.S. Cl. ........................................ 345/98; 345/100
(58) Field of Classification Search ........... 345/87–100, 345/204; 377/64
See application file for complete search history.

(56) References Cited

U.S. PATENT DOCUMENTS

| | | | |
|---|---|---|---|
| 5,434,899 A | 7/1995 | Huq et al. | |
| 5,812,284 A | 9/1998 | Mizutani et al. | |
| 5,818,412 A | 10/1998 | Maekawa | |
| 5,859,630 A | 1/1999 | Huq | |
| 5,966,115 A * | 10/1999 | Aoki | ........................... 345/204 |
| 6,031,249 A | 2/2000 | Yamazaki et al. | |
| 6,115,097 A | 9/2000 | Yamazaki | |
| 6,144,466 A | 11/2000 | Mizutani et al. | |
| 6,377,099 B1 | 4/2002 | Cairns et al. | |
| 6,392,628 B1 | 5/2002 | Yamazaki et al. | |

(Continued)

FOREIGN PATENT DOCUMENTS

EP    0 535 569    4/1993

(Continued)

OTHER PUBLICATIONS

Office Action (Application No. 2002-0041596) dated Mar. 28, 2008.

(Continued)

*Primary Examiner*—Regina Liang
(74) *Attorney, Agent, or Firm*—Eric J. Robinson; Robinson Intellectual Property Law Office, P.C.

(57) ABSTRACT

A clock pulse with a smaller amplitude voltage than the power supply voltage of the shift register is inputted to the shift register. The gate width of a TFT that constitutes a second clocked inverter of the shift register is set wide so as to reduce fluctuation in output electric potential due to leak current of a first clocked inverter. Further, a TFT is added to a first clocked inverter. A signal with an amplitude voltage of the same level as the power supply voltage is inputted to a gate electrode of the added TFT to switch between ON and OFF. The leak current of the first clocked inverter is thus cut off.

20 Claims, 28 Drawing Sheets

U.S. PATENT DOCUMENTS

| | | |
|---|---|---|
| 6,580,411 B1 | 6/2003 | Kubota et al. |
| 6,639,575 B1 | 10/2003 | Tsunashima et al. |
| 6,879,313 B1 | 4/2005 | Kubota et al. |
| 6,909,417 B2 | 6/2005 | Washio et al. |
| 2003/0174115 A1 | 9/2003 | Washio et al. |
| 2005/0057556 A1 | 3/2005 | Kubota et al. |

FOREIGN PATENT DOCUMENTS

| | | |
|---|---|---|
| EP | 0 553 823 | 8/1993 |
| EP | 1 056 069 | 11/2000 |
| JP | 57-158095 | 9/1982 |
| JP | 62-185361 | 8/1987 |
| JP | 05-216441 | 8/1993 |
| JP | 11-134893 | 5/1999 |
| JP | 2000-187994 | 7/2000 |
| JP | 2000-267136 | 9/2000 |
| JP | 2000-339984 | 12/2000 |
| WO | WO 98/26423 | 6/1998 |

OTHER PUBLICATIONS

European Search Report dated Jun. 9, 2005 for EP 02015359.9.
Search Report and Written Opinion, Application No. 200203974-1, Intellectual Propertry Office of Singapore, May 7, 2004.
Partial European Search Report dated Feb. 11, 2005 for EP 02015359.9.
Search Report (Application No. 200508619-4) dated Sep. 26, 2008.

* cited by examiner

PRIOR ART

SHIFT REGISTER AND METHOD OF DRIVING THE SAME

BACKGROUND OF THE INVENTION

1. Field of the Invention

The present invention relates to a shift register. Specifically, the present invention relates to a shift register composed of thin film transistors (hereinafter referred to as TFTs) and to a method of driving the shift register.

2. Description of the Related Art

Shift registers, which receive a clock pulse and a start pulse to output pulses (sampling pulses) sequentially, are used in various circuits. In a display device which has a plurality of pixels arranged to form a matrix, shift registers are particularly used as a gate signal line driving circuit and a gate signal line driving circuit for selecting pixels and inputting signals to the selected pixels.

An example of the structure of a general shift register is shown in FIG. 5. The shift register has first to r-th (r is a natural number equal to or larger than 3) stages. Each stage is composed of a first clocked inverter CKINV1, a second clocked inverter CKIV2, and an inverter INV.

The i-th (i is a natural number equal to or less than r) stage is referred to as SR_i. A first clocked inverter, a second clocked inverter, and an inverter that constitute the i-th stage are referred to as CKINV1_i, CKINV2_i, and IV-i, respectively.

In the first stage SR_1, a start pulse SP is inputted from the external to an input terminal of the first clocked inverter CKINV1_1, and an output terminal of the first clocked inverter CKINV1_1 is connected to an input terminal of the inverter INV_1 and to an output terminal of the second clocked inverter CKINV2_1. An input terminal of the second clocked inverter CKINV2_1 is connected to an output terminal of the inverter INV_1. The output terminal of the inverter INV_1 serves as the output terminal of the first stage SR_1.

In the second stage SR_2, an input terminal of the first clocked inverter CKINV1_2 is connected to an output terminal of the inverter INV_1 in the first stage SR_1, and an output terminal of the first clocked inverter CKINV1_2 is connected to an input terminal of the inverter INV_2 and to an output terminal of the second clocked inverter CKINV2_2. An input terminal of the second clocked inverter CKINV2_2 is connected to an output terminal of the inverter INV_2. The output terminal of the inverter INV_2 serves as the output terminal of the second stage SR_2.

Generally, in a j-th (j is a natural number equal to or larger than 2, and equal to or smaller than r) stage, an input terminal of the first clocked inverter CKINV1_j is connected to an outputted terminal of the inverter INV_j-1 in the (j-1)-th stage SR_j-1, and an output terminal of the first clocked inverter CKINV1_j is connected to an input terminal of the inverter INV_j and to an output terminal of the second clocked inverter CKINV2_j. An input terminal of the second clocked inverter CKINV2_j is connected to an output terminal of the inverter INV_j. The output terminal of the inverter INV_j serves as the output terminal of the j-th stage.

When a start pulse SP is inputted to the first stage, the shift register composed of the first stage circuit SR_1 to the r-th stage circuit SR_r that are structured as above sequentially outputs shifted pulses S_1 to S_r from the output terminals of the first stage circuit SR_1 to the r-th stage circuit SR_r in sync with a clock pulse CK and an inverted clock pulse CKB which is obtained by inverting the polarity of the clock pulse CK. The clock pulse CK and inverted clock pulse CKB are inputted to the first clocked inverters CKINV1 and second clocked inverters CKINV2 of the first to r-th stages.

FIG. 4 is an example of detailed circuit diagram of the first clocked inverter CKINV1, second clocked inverter CKINV2, and inverter INV that constitute each stage in the shift register with the structure as shown in FIG. 5.

Vdd represents a high power supply electric potential and Vss represents a low power supply electric potential. Here, the high power supply electric potential Vdd is set higher than the low power supply electric potential Vss. The electric potential difference between the high power supply electric potential Vdd and the low power supply electric potential Vss corresponds to the power supply voltage of the shift register.

The first clocked inverter CKINV1 is composed of p-channel TFTs 501a and 501b and n-channel TFTs 501d and 501c. In this specification, a p-channel TFT and n-channel TFT of the first clocked inverter CKINV1 that receive a clock pulse CK or an inverted clock pulse CKB through their gate electrodes are denoted by 501a and 501d, respectively. Then gate electrodes of the p-channel TFT 501b and n-channel TFT 501c are connected to the input terminal of the first clocked inverter CKINV1.

If a clock pulse CK is to be inputted to the gate electrode of the p-channel TFT 501a, an inverted clock pulse CKB is inputted to the gate electrode of the n-channel TFT 501d. On the other hand, if an inverted clock pulse CKB is to be inputted to the gate electrode of the p-channel TFT 501a, a clock pulse CK is inputted to the gate electrode of the n-channel TFT 501d.

The source electrode of the p-channel TFT 501a is kept at the same level as the high power supply electric potential Vdd and the drain electrode thereof is connected to the source electrode of the p-channel TFT 501b. The drain electrode of the p-channel TFT 501b is connected to the drain electrode of the n-channel TFT 501c and the source electrode of the n-channel TFT 501c is connected to the drain electrode of the n-channel TFT 501d. The source electrode of the n-channel TFT 501d is kept at the same level as the low power supply electric potential Vss. The gate electrodes of the p-channel TFT 501b and the n-channel TFT 501c serve as the input terminal of the first clocked inverter CKINV1. The drain electrodes of the p-channel TFT 501b and the n-channel TFT 501c serve as the output terminal of the first clocked inverter CKINV1.

The second clocked inverter CKINV2 is composed of p-channel TFTs 502a and 502b and n-channel TFTs 502d and 502c. In this specification, a p-channel TFT and an n-channel TFT of the second clocked inverter CKINV2 which receive a clock pulse CK or an inverted clock pulse CKB through their gate electrodes are denoted by 502a and 502d, respectively. Further, gate electrodes of the p-channel TFT 502b and n-channel TFT 502c are connected to the output terminal of the inverter INV.

If a clock pulse CK is to be inputted to the gate electrode of the p-channel TFT 501a that constitutes the first clocked inverter CKINV1, an inverted clock pulse CKB is inputted to the gate electrode of the p-channel TFT 502a that constitutes the second clocked inverter CKINV2 and a clock pulse CK is inputted to the gate electrode of the n-channel TFT 502d. On the other hand, if an inverted clock pulse CKB is to be inputted to the gate electrode of the p-channel TFT 501a that constitutes the first clocked inverter CKINV1, a clock pulse CK is inputted to the gate electrode of the p-channel TFT 502a that constitutes the second clocked inverter CKINV2 and an inverted clock pulse CKB is inputted to the gate electrode of the n-channel mm 502d.

The source electrode of the p-channel TFT 502a is kept at the same level as the high power supply electric potential Vdd and the drain electrode thereof is connected to the source electrode of the p-channel TFT 502b. The drain electrode of the p-channel TFT 502b is connected to the drain electrode of the n-channel TFT 502c and the source electrode of the n-channel TFT 502c is connected to the drain electrode of the n-channel TFT 502d. The source electrode of the n-channel TFT 502d is kept at the same level as the low power supply electric potential Vss. The drain electrodes of the p-channel TFT 502b and n-channel TFT 502c serve as the output terminal of the second clocked inverter CKINV2.

The inverter INV is composed of a p-channel TFT 503a and an n-channel TFT 503b. A source electrode of the p-channel TFT 503a is kept at the same level as the high power supply electric potential Vdd and a drain electrode of the p-channel TFT 503a is connected to a drain electrode of the n-channel TFT 503b. A source electrode of the n-channel TFT 503b is kept at the same level as the low power supply electric potential Vss. Gate electrodes of the p-channel TFT 503a and n-channel TFT 503b serve as the input terminal of the inverter INV. The drain electrodes of the p-channel TFT 503a and n-channel TFT 503b serve as the output terminal of the inverter INV.

If a gate electrode of a p-channel TFT 501a_i of the first clocked inverter CKINV1_i of the i-th (i is a natural number) stage receives a clock pulse CK, an inverted clock pulse CKB is inputted to a gate electrode of a p-channel TFT 501a_i−1 of the first clocked inverter CKINV1_i−1 of the (i−1)-th stage.

P-channel TFTs 501a and 501b and n-N-channel TFTs 501c and 501d that constitute the first clocked inverter CKINV1_i (i is a natural number) of the i-th stage are denoted by 501a_i and 501b_i, and 501c_i and 501d_i, respectively. Similarly, p-channel TFTs 502a and 502b and n-channel TFTs 502c and 502d that constitute the second clocked inverter CKINV2_i of the i-th stage are denoted by 502a_i and 502b_i, and 502c_i and 502d_i, respectively. An n-channel TFT 503a and p-channel TFT 503b that constitute the inverter INV_i of the i-th stage are denoted by 503a_i and 503b_i, respectively.

FIG. 7 is a timing chart showing an ideal method of driving the shift register structured as shown in FIGS. 4 and 5. The concrete operation thereof are described below.

The shift register receives a clock pulse CK, an inverted clock pulse CKB obtained by inverting the polarity of the clock pulse CK, and a start pulse SP. In the first clocked inverter CKINV1_1 of the first stage SR_1, an inverted clock pulse CKB is inputted to the gate electrode of the p-channel TFT 501a_1 and a clock pulse CK is inputted to the gate electrode of the n-channel TFT 501d_1. A start pulse SP is inputted to the gate electrodes of the p-channel TFT 501b_1 and n-channel TFT 501c_1 of the first clocked inverter CKINV1_1.

The relation of the start pulse SP and the clock pulse CK and inverted clock pulse CKB is as shown in the timing chart of FIG. 7.

A start pulse SP is inputted to the input terminal of the first clocked inverter CKINV1_1 of the first stage SR_1. In other words, the first clocked inverter CKINV1_1 receives "Hi" electric potential upon input of the start pulse SP, and receives a clock pulse CK and an inverted clock pulse CKB as well. The n-channel TFTs 501c_1 and 501d_1 of the first clocked inverter CKINV1_1 are turned ON. The electric potential of the output terminal of the first clocked inverter CKINV1_1 is thus set to the low power supply electric potential Vss. That is, an output SB_1 of the first clocked inverter CKINV1_1 of the first stage is "Lo" electric potential. At this point, the p-channel TFT 502a_1 and n-channel TFT 502d_1 of the second clocked inverter CKINV2_1 of the same stage are turned OFF by a clock pulse CK and inverted clock pulse CKB that are inputted to the gate electrodes of the TFTs 502a_1 and 502d_1.

On the other hand, both the p-channel TFT 501a_2 and n-channel TFT 501d_2 of the first clocked inverter CKINV1_2 of the second stage are turned OFF by a clock pulse CK and inverted clock pulse CKB that are inputted to the gate electrodes of the TFTS 501a_2 and 501d_2.

The p-channel TFT 502a_2 and n-channel TFT 502d_2 of the second clocked inverter CKINV2_2 are both turned ON by a clock pulse CK and inverted clock pulse CKB that are inputted to the gate electrodes of the TFTs 502a_2 and 502d_2, and "Lo" electric potential is inputted to the input terminal of the second clocked inverter CKINV2_2. Therefore, the high power supply electric potential Vdd is outputted from the output terminal of the second clocked inverter CKINV2_2. In other words, the second clocked inverter CKINV2_2 outputs "Hi" electric potential.

Next, a clock pulse CK and an inverted clock pulse CKB turns the n-channel TFT 501d_1 into OFF in the first clocked inverter CKINV1_1 of the first stage SR_1. On the other hand, the n-channel TFT 502d_1 is turned ON in the second clocked inverter CKINV2_1.

The output SB_1 of the first clocked inverter CKINV1_1 is inputted to the input terminal of the second clocked inverter CKINV2_1 through the inverter INV_1. In other words, a signal obtained by inverting the polarity of the output SB_1 of the first clocked inverter CKINV1_1 is inputted to the input terminal of the second clocked inverter CKINV2_1. This input signal turns the n-channel TFT 502c_1 of the second clocked inverter CKINV2_1 ON. In this way, the output terminal of the second clocked inverter CKINV2_1 is set to the low power supply electric potential Vss. That is, the output SB_1 of the second clocked inverter CKINV2_1 is "Lo" electric potential.

On the other hand, "Hi" electric potential is inputted from the first stage SR_1 to the input terminal of the first clocked inverter CKINV1_2 of the second stage. A clock pulse CK and an inverted clock pulse CKB turn the n-channel TFT 501d_2 ON. Thus, the output terminal of the first clocked inverter CKINV1_2 of the second stage is set to the low power supply electric potential Vss, and the output SB_2 of the first clocked inverter CKINV1_2 of the second stage obtains "Lo" electric potential.

A clock pulse CK and an inverted clock pulse CKB again turn the p-channel TFT 501a_1 of the first clocked inverter of the first stage ON. At this point, a start pulse SP is not inputted and therefore the p-channel TFT 501b_1 of the first clocked inverter is also ON. Accordingly, the output terminal of the first clocked inverter CKINV1_1 of the first stage is set to the high power supply electric potential Vdd and the output SB_1 of the first clocked inverter obtains "Hi" electric potential.

The outputs of the first clocked inverter CKINV1 and second clocked inverter CKINV2 are changed as described above. The outputs S of the respective stages are thus outputted while each output is shifted sequentially from the inputted start pulse SP by half a cycle of clock pulse CK. The shift register shown in FIG. 4 outputs pulses in this way.

In contrast with the shift register structured as shown in FIG. 4, there is a shift register that outputs a pulse obtained from NAND operation of output signals S of adjacent stages. An example of this shift register is shown in FIG. 10. In FIG.

10, components which are identical with those in FIG. 4 are denoted by the same reference symbols and explanations thereof will be omitted.

An output S_i of the i-th stage circuit SR_i and an output S_i+1 of the (i+1)-th ((i+1) is a natural number equal to or smaller than r) stage circuit SR_i+1 are inputted to an i-th NAND circuit NAND_i. The i-th NAND circuit NAND_i outputs an i-th pulse SMP_i. The pulse SMP_i is an output pulse of the shift register.

FIG. 11 is a timing chart for a method of driving the shift register shown in FIG. 10. The operation in FIG. 10 is identical with the operation in FIG. 7 until sequentially outputting shifted pulses S_1 to S_r from the output terminals of the first stage circuit SR_1 to the r-th stage circuit SR_r is completed. Thereafter outputs of adjacent stages are inputted to the respective NAND circuits, NAND_1 to NAND_r−1, and pulses SMP_1 to SMP_r−1 are outputted sequentially. In this way, the shift register shown in FIG. 10 outputs pulses.

The shift register shown in FIGS. 4, 5 and 10 needs a small number of elements to construct a circuit. Accordingly, only a small load capacity is required and the operation at high frequency is relatively easy.

In general, a shift register operates with the power supply voltage set almost equal to the amplitude voltage of signals of clock pulse and start pulse. The power supply voltage of a shift register is usually set to about 10 V.

Pulse signals such as clock pulses and start pulses to be inputted to a shift register are usually outputted by a pulse signal controlling circuit that is formed on a single crystal IC substrate. The pulse signal controlling circuit normally outputs a control signal with an amplitude voltage of about 3.3 V. The amplitude voltage of a pulse signal outputted from a pulse signal generating circuit is usually increased by a level shifter or the like to reach about the same level as the power supply voltage of the shift register before inputted to the shift register.

Now, assume that the signal voltage of a pulse signal to be inputted to a shift register is not increased by a level shifter or the like. This corresponds to the case in which the power supply voltage (corresponding to the electric potential difference between the high power supply electric potential Vdd and the low power supply electric potential Vss) of the elements that constitute the shift register of FIG. 4, namely, the power supply electric potential of the shift register is larger than the amplitude voltage of start pulse SP and clock pulse CK.

The operation of the shift register in this case will be described with reference to a timing chart of FIG. 6. For the circuit structure of the shift register, FIG. 4 is referred to. Assume that the power supply voltage of the shift register is 10 V (the high power supply electric potential Vdd is 10 V and the low power supply electric potential Vss is 0 V) and the amplitude voltage of pulse signals such as clock pulses and start pulses is 3.0 V for the sake of explanation. Then the electric potential which is corresponding to "Lo" of the pulse signals (the lowest electric potential) is set to 3.5 V and the electric potential which is corresponding to "Hi" of the pulse signals (the highest electric potential) is set to 6.5 V.

The first clocked-inverter CKINV1 is focused. There is considered a case in which a clock pulse CK and an inverted clock pulse CKB are inputted thereto and the gate electrode of the p-channel TFT 501a receives the electric potential which is corresponding to "Hi", in this case, 6.5 V and, at the same time, the gate electrode of the n-channel TFT 501d receives the electric potential which is corresponding to "Lo", in this case, 3.5 V. In this state, the p-channel TFT 501a and the n-channel TFT 501d are ideally both turned OFF. However, the following problems arise because the amplitude voltage of clock pulse CK and inverted clock pulse CKB is smaller than the power supply voltage.

In the p-channel TFT 501a, the electric potential of its source electrode exceeds the electric potential of the gate electrode thereof. In this example, the electric potential of the source electrode of the p-channel TFT 501a is 10 V that is the high power supply electric potential Vdd and the electric potential of the gate electrode thereof is 6.5 V that is "Hi" electric potential of the clock pulse CK or inverted clock pulse CKB, and the electric potential difference between the source electrode and the gate electrode is 3.5 V. If the threshold voltage of the p-channel TFT 501a (the electric potential of the gate electrode with respect to the electric potential of the source electrode in the p-channel TFT) is −3.5 V or more, in other words, if the absolute value of the threshold voltage of the p-channel TFT 501a is smaller than 3.5 V, the p-channel TFT 501a is undesirably turned ON to make its source-drain conductive.

Similarly, in the n-channel TFT 501d, the electric potential of its source electrode is below the electric potential of the gate electrode thereof. In this example, the electric potential of the source electrode of the n-channel TFT 501d is 0 V that is the low power supply electric potential Vss and the electric potential of the gate electrode thereof is 3.5 V that is "Lo" electric potential of the clock pulse CK or inverted clock pulse CKB, and the electric potential difference between the source electrode and the gate electrode is 3.5 V. If the threshold voltage of the n-channel TFT 501d (the electric potential of the gate electrode with respect to the electric potential of the source electrode in the n-channel TFT) is 3.5 V or less, the n-channel TFT 501d is undesirably turned ON.

Areas indicated by broken lines in the timing chart show the operation of the shift register when the TFTs that should be OFF are turned ON due to the problems described above.

At this point, if a start pulse SP is inputted to the input terminal of the first clocked inverter CKINV1_1 of the first stage SR_1 as shown in the timing chart, the first clocked inverter CKINV1_1 outputs a signal SB_1 in sync with the clock pulse CK and inverted clock pulse CKB.

The output from the inverter INV_1 of the first stage SR_1 (denoted by S_1 in the drawing) is inputted to the first clocked inverter CKINV1_2 of the second stage SR_2.

If the pulse signal S_1 outputted from the first stage SR_1 is inputted to the input terminal of the first clocked inverter CKINV1_2 of the second stage SR_2 and the n-channel TFT 501d_2 that should be OFF is turned ON due to the problems described above, leak current flows through the n-channel TFT 501c_2 and n-channel TFT 501d_2. While this leak current is flowing, the output electric potential SB_2 of the first clocked inverter CKINV1_2 becomes lower than the high power supply electric potential Vdd (indicated by a broken line 401n in FIG. 6).

On the other hand, if the pulse signal S_1 outputted from the first stage SR_1 is not inputted to the input terminal of the first clocked inverter CKINV1_2 of the second stage SR_2 and the p-channel TFT 501a_2 that should be OFF is turned ON due to the problems described above, leak current flows through the p-channel TFT 501a_2 and p-channel TFT 501b_2. While this leak current is flowing, the output electric potential SB_2 of the first clocked inverter CKINV1_2 becomes higher than the low power supply electric potential Vss (indicated by a broken line 401p in FIG. 6).

The similar phenomenon takes place in the third stage SR_3 and its subsequent stages and the leak current causes the output electric potential SB of the first clocked inverter CKINV1 of the stage in question to fluctuate from the ideal operation shown in the timing chart of FIG. 7.

As described above, if a pulse is inputted to the input terminal of the first clocked inverter CKINV1 while the p-channel TFT 501a and n-channel TFT 501d that should be OFF are turned ON, current flows through the n-channel TFTs 501c and 501d (this current is hereinafter called as leak current of n-channel TFTs) to output a lower electric potential than the intended output electric potential Vdd.

Also, if a pulse is not inputted to the input terminal of the first clocked inverter CKINV1 while the TFT 501a and TFT 501d that should be OFF are turned ON, current flows through the TFTs 501a and 501b (this current is hereinafter called as leak current of p-channel TFTs) to output a higher electric potential than the intended output electric potential Vss.

When the leak current is large, it is impossible to make pulses of outputs SB shift.

In this way, the shift register cannot perform output normally to be likely to malfunction when the TFTs that should remain OFF are turned ON.

In order to prepare against the malfunction caused from the reason above, a conventional shift register receives pulse signals such as a clock pulse CK and a start pulse SP after the amplitude voltage of the pulse signals is increased by a level shifter to the level of the power supply voltage of the shift register.

A display device with a driving circuit that has a shift register including a level shifter is taken as an example here. The level shifter in this case may be formed on a substrate on which the driving circuit with the shift register and a pixel portion which receives signals outputted from the driving circuit to display an image are formed (this substrate is called a panel substrate). Alternatively, the level shifter may be formed on a single crystal IC substrate which is separate from the panel substrate.

If the level shifter is formed on a separate substrate from the panel substrate, circuits on the periphery of the pixel portion occupy a large area in the display device. In addition, power consumption is large because the wiring capacitance and wiring resistance are large at a connection portion between the level shifter and the circuits on the panel substrate.

On the other hand, if the level shifter is formed on the panel substrate, the following problem arises. Signal lines to which a clock pulse CK and a start pulse SP are inputted are large in load capacitance. Therefore, pulse signals such as a clock pulse CK and a start pulse SP are dulled in the buffer output after level shifting to cause timing deviation due to signal delay. In order to prevent the pulse signals from being dulled, the current supplying ability of the buffer has to be enhanced.

As described above, a shift register which has a level shifter formed on a panel substrate has problems such as difficulties in operating at high frequency, noises in power supply lines, and a large area for placement.

In order to increase the amplitude voltage of inputted pulse signals, a shift register can employ a level shifter formed on a panel substrate or a level shifter formed on a separate substrate from the panel substrate. In either way, however, the shift register has problems including difficulties in operating at high frequency, noises in power supply lines, and a large area for placement.

SUMMARY OF THE INVENTION

An object of the present invention is therefore to provide a shift register that is free from the above problems and a method of driving the shift register.

A shift register of the present invention receives a clock pulse and start pulse which has a smaller amplitude voltage than the power supply voltage of the shift register. Therefore, it becomes unnecessary to form outside a panel substrate a level shifter for raising the amplitude voltage of a clock pulse and start pulse and to input to the panel the clock pulse and start pulse which have been subjected to level shifting to raise their amplitude voltage to the level of the power supply voltage. Accordingly, it is possible to solve the problem of increased power consumption due to the wiring line capacitance and wiring line resistance between the circuits on the panel substrate and the level shifter.

Further, according to the present invention, it is unnecessary to form on a panel substrate a level shifter for raising the amplitude voltage of a clock pulse and start pulse and to input to signal lines the clock pulse and start pulse which have been subjected to level shifting. Therefore, an influence of dulling due to the load of the signal lines is suppressed and the shift register can operate at high frequency. An influence of noises of the power supply lines can also be suppressed.

In addition, according to the present invention, the area required to place a shift register is reduced since a level shifter is unnecessary.

In this way, a method of driving a shift register at high frequency with less power consumption is provided while the problems such as a noise of a power supply line and a large area for placement are solved.

In the case of employing the above driving method, if a second clocked inverter that constitutes the shift register has high current capacity, it is possible to reduce fluctuation in output electric potential of a first clocked inverter due to current (leak current) caused to flow by a TFT in an ON state of the first clocked inverter that should be OFF. Then, the gate width of a TFT that constitutes the second clocked inverter is set wide.

In a conventional shift register, the only task of a second clocked inverter CKINV2 in each stage is holding a signal outputted from a first clocked converter CKINV1. Accordingly, in order to reduce the load due to the second clocked inverter, gate widths of TFTs that constitute the second clocked inverter CKINV2, namely, p-channel TFTs 502a and 502b and n-channel TFTs 502c and 502d, are often fairly smaller than gate widths of TFTs that constitute the first clocked inverter CKINV1, namely, p-channel TFTs 501a and 501b and n-channel TFTs 501c and 501d, with respect to the respective polarity. For instance, gate widths of the TFTs that constitute the second clocked inverter are set to ⅒ of gate widths of the TFTs that constitute the first clocked inverter. Note that all of these TFTs have the same gate length.

In the present invention, on the other hand, a shift register receives a clock pulse and start pulse with a smaller amplitude voltage than the power supply voltage of the shift register to cause a problem of the leak current. Therefore, the leak current is reduced by setting gate widths of TFTs that constitute a second clocked inverter wider than those in the prior art.

For example, there is considered a case in which the absolute value of the electric potential difference between the electric potential of a source electrode of an n-channel TFT that constitute a first clocked inverter of the shift register and the lowest electric potential (corresponding to "Lo" electric potential) of a clock pulse or inverted clock pulse inputted to a gate electrode of the n-channel TFT is larger than the absolute value of the threshold voltage of the n-channel TFT. By setting wide the gate width of a p-channel TFT that constitutes the second clocked inverter, it becomes possible to reduce fluctuation in output electric potential of the first clocked inverter due to current (leak current) caused to flow by the n-channel TFT in an ON state that should be OFF.

In addition, there is considered a case the absolute value of the electric potential difference between the electric potential of a source electrode of a p-channel TFT that constitute a first clocked inverter of the shift register and the highest electric potential (corresponding to "Hi" electric potential) of a clock pulse or inverted clock pulse inputted to a gate electrode of the p-channel TFT is larger than the absolute value of the threshold voltage of the p-channel TFT. By setting wide the gate width of an n-channel TFT that constitutes the second clocked inverter, it becomes possible to reduce fluctuation in output electric potential of the first clocked inverter due to a current (leak current) caused to flow by the p-channel TFT in an ON state that should be OFF.

Furthermore, another TFT is added to the first clocked inverter. The power supply electric potential is outputted to an output terminal of the first clocked inverter through source-drain of the added TFT. A signal which has an amplitude voltage of the same level as the power supply voltage of the shift register is inputted to a gate electrode of the added TFT. The added TFT is turned OFF when the leak current causes a problem. Thus, current (the leak current) which flows in the first clocked inverter is cut.

Thus obtained is a shift register that has no fear of malfunction.

With the above structure, a shift register which does not malfunction and which can operate at high frequency with low power supply voltage is provided as well as a method of driving the shift register.

DETAILED DESCRIPTION OF THE PREFERRED EMBODIMENTS

Embodiment 1

Figure 4:
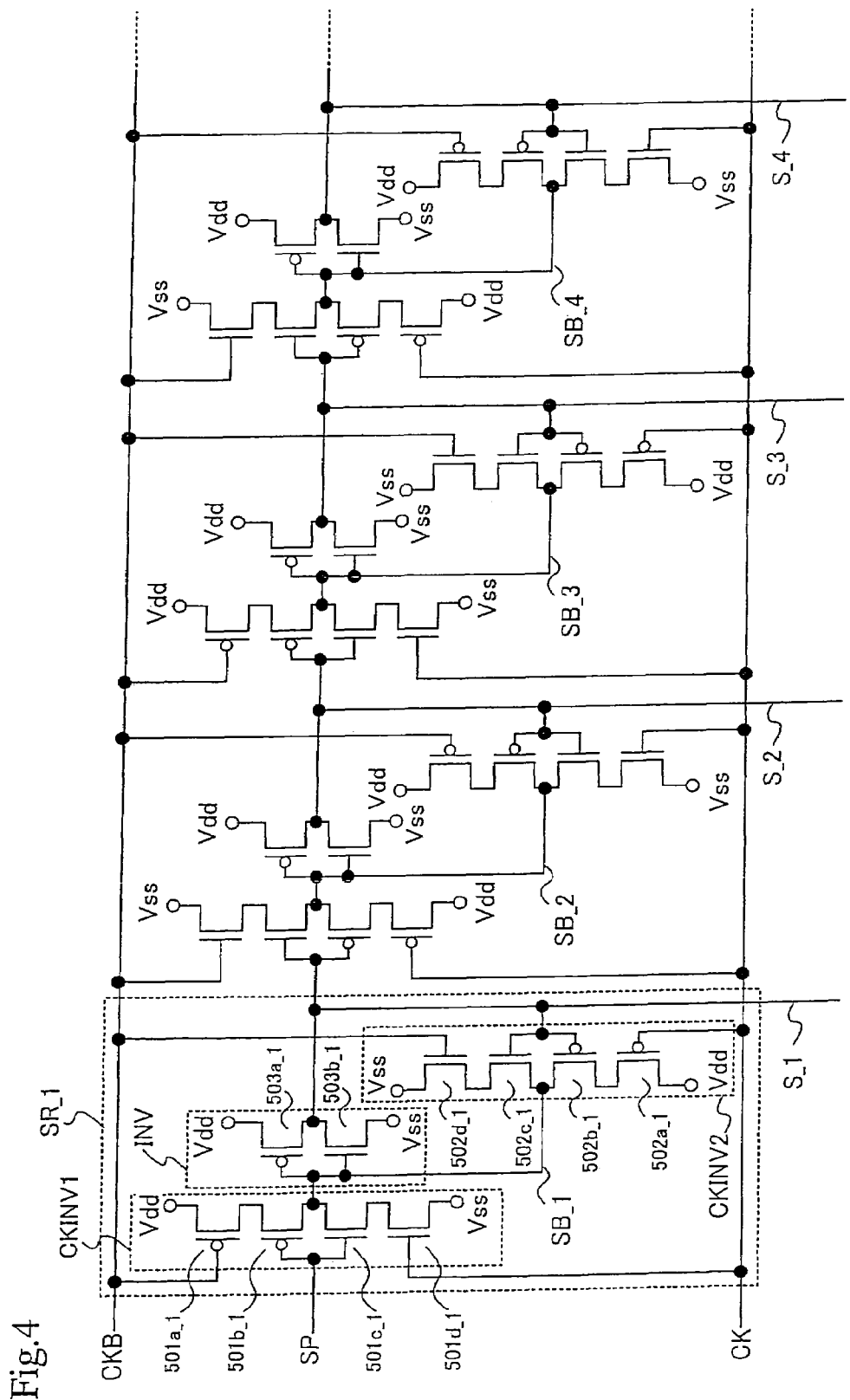
FIG. 4 is a diagram showing the structure of a shift register.
Figure 5:
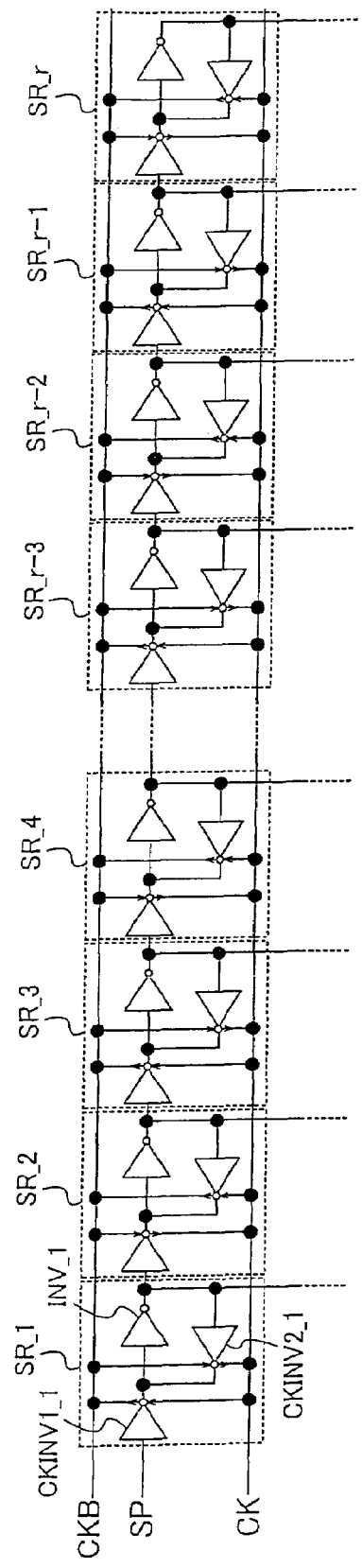
FIG. 5 is a diagram showing the structure of a shift register.

A circuit diagram, which is equivalent to the circuit diagram of FIG. 4 as an example of prior art, is used to describe a shift register according to Embodiment 1 of the present invention. Identical components with those in FIG. 4 are denoted by the same reference symbols and explanations thereof are omitted.

The shift register of the present invention receives a start pulse SP and clock pulse CK with a smaller amplitude voltage than power supply voltage (corresponding to a electric potential difference between a high power supply electric potential Vdd and a low power supply electric potential Vss) of the shift register.

Here, each stage of the shift register has a first clocked inverter and a second clocked inverter. The second clocked inverter CKINV2 has p-channel TFTs 502a and 502b and their gate width is set to ½ or more of the gate width of p-channel TFTs 501a and 501b of the first clocked inverter.

Figure 26A:
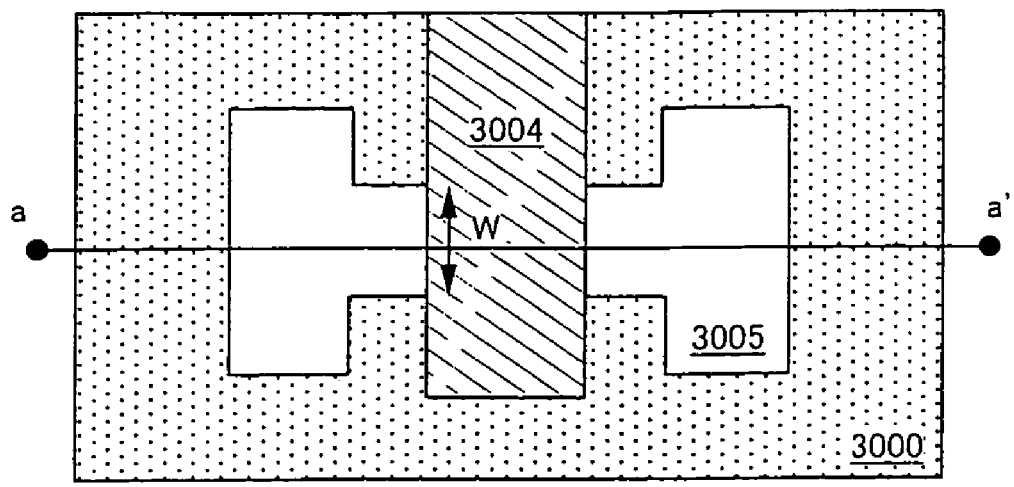
FIGS. 26A and 26B are diagrams showing the gate width of a TFT.
Figure 26B:
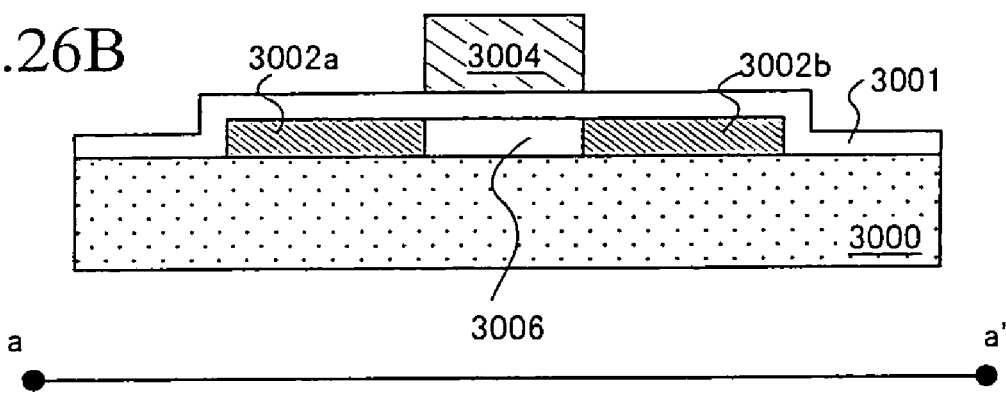

The gate width of a TFT here refers to a length of a gate electrode portion, that overlaps a semiconductor active layer of the TFT, in the perpendicular direction to the moving direction of carriers. A gate width W is described with reference to FIGS. 26A and 26B. A sectional view taken along the line a-a' of FIG. 26A corresponds to FIG. 26B. Denoted by 3000 is a substrate with an insulating surface; 3005, a semiconductor active layer; 3004, a gate electrode; and 3001, a gate insulating film. The semiconductor active layer 3005 has regions 3002a and 3002b which function as a source region and a drain region, and has a channel region 3006. The gate width is indicated by W in the drawings.

Each stage of the shift register is composed of a first clocked inverter and a second clocked inverter. The second clocked inverter has n-channel TFTs 502c and 502d and their gate width is set to ½ or more of the gate width of n-channel TFTs 501c and 501d of the first clocked inverter.

The current capacity of a second clocked inverter CKINV2 in the circuit of each stage is enhanced in this way. With the enhanced current-capacity, the "Hi" electric potential (high power supply electric potential Vdd) output from the second clocked inverter CKINV2 can reduce fluctuation in output electric potential SB due to leak current of n-channel TFTs of a first clocked inverter CKINV1 in a shift register that receives a start pulse SP and clock pulse CK with a smaller amplitude voltage than the power supply voltage of the shift register.

In the same manner as above, the "Lo" electric potential (low power supply electric potential Vss) output from the second clocked inverter CKINV2 can reduce fluctuation in output electric potential SB due to leak current of p-channel TFTs of a first clocked inverter CKINV1.

Figure 3:
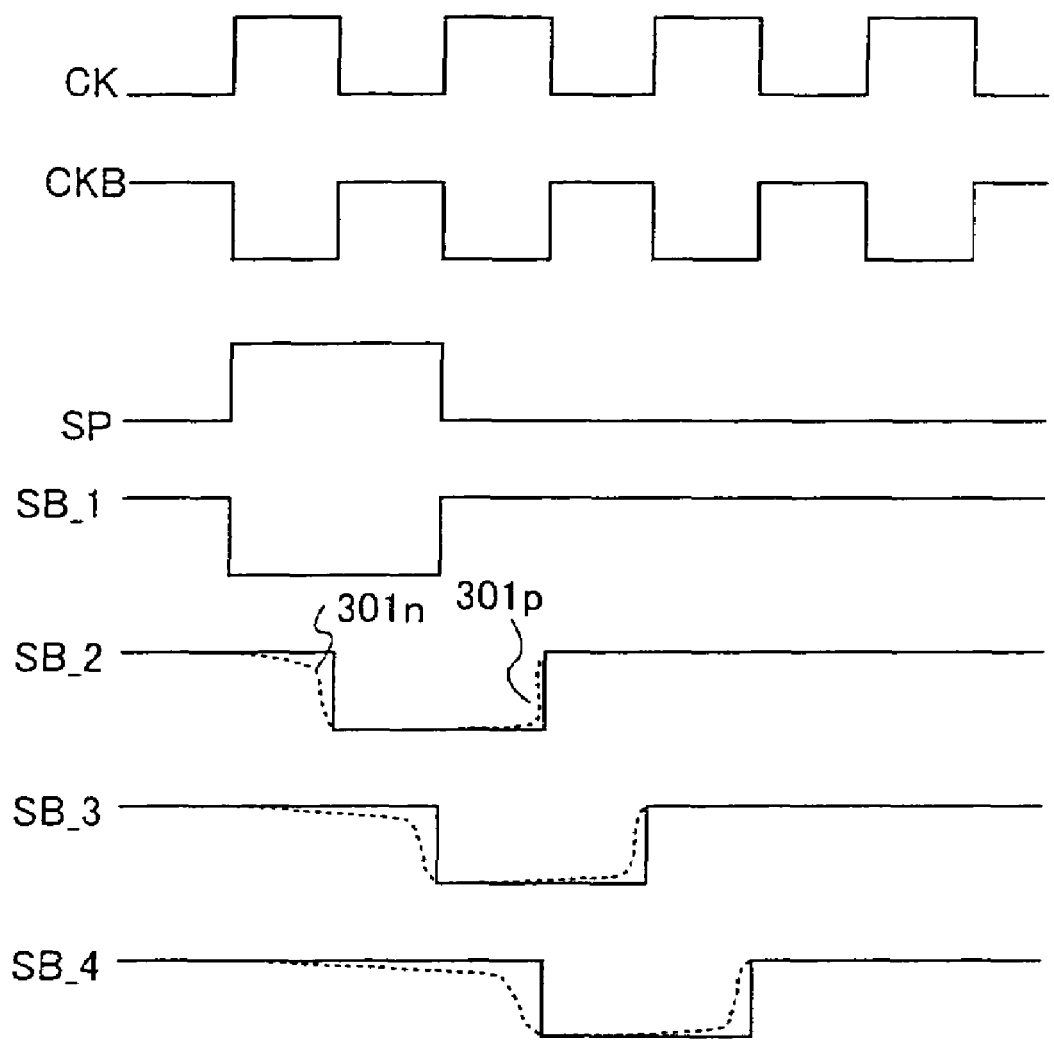
FIG. 3 is a timing chart showing a method of driving a shift register according to the present invention.

The operation of the shift register structured as above is described with reference to a timing chart of FIG. 3. Broken lines indicate fluctuation in output electric potential SB due to leak current. In FIG. 3, a broken line 301*n* shows fluctuation in output electric potential SB_2 due to leak current flowing through n-channel TFTs 501*c* and 501*d* of the first clocked inverter CKINV1_2 of the second stage. A broken line 301*p* shows fluctuation in output electric potential SB_2 due to leak current flowing through p-channel TFTs 501*a* and 501*b* of the first clocked inverter CKINV1_2 of the second stage.

Figure 6:
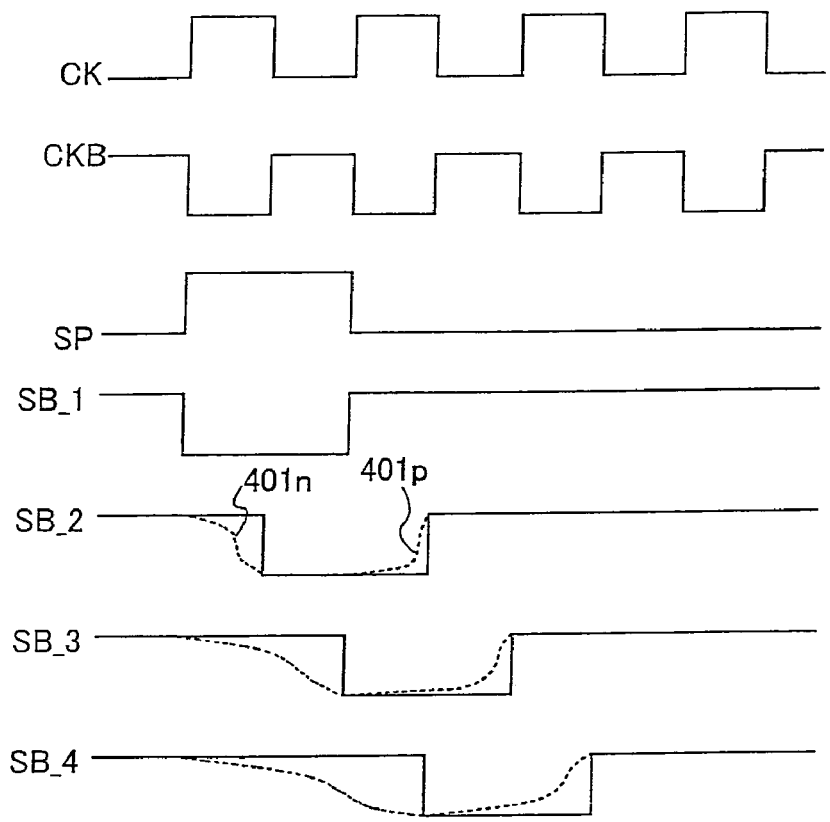
FIG. 6 is a timing chart showing a method of driving a conventional shift register.
Figure 7:
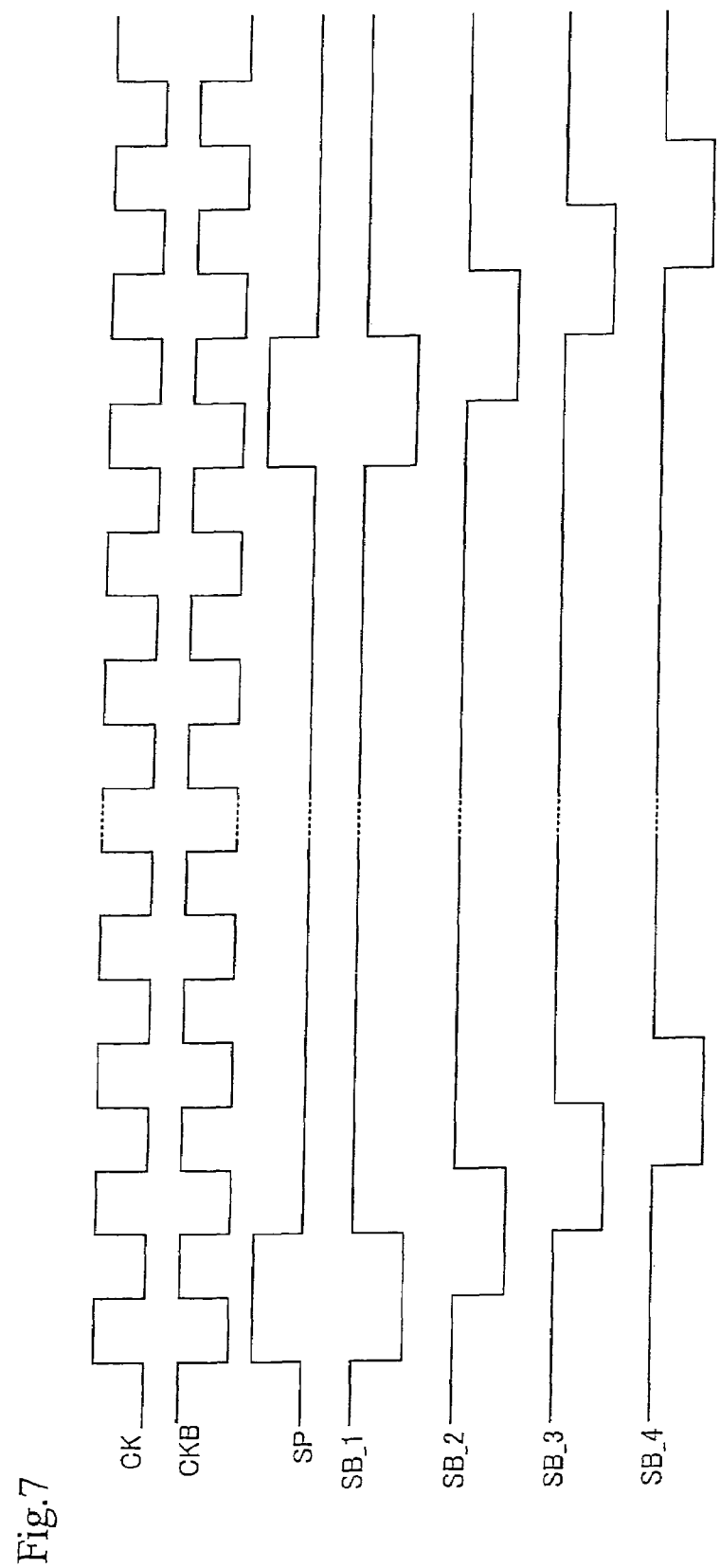
FIG. 7 is a timing chart showing an ideal method of driving a shift register.

By increasing the gate width of p-channel TFTs of the second clocked inverter CKINV2, the fluctuation 301*n* is made smaller than the fluctuation 401*n* of the output electric potential SB_2 due to the leak current of the example of prior art shown in FIG. 6.

Also, by increasing the gate width of n-channel TFTs of the second clocked inverter CKINV2, the fluctuation 301*p* is made smaller than the fluctuation 401*p* of the output electric potential SB_2 due to the leak current of the example of prior art shown in FIG. 6.

According to the above structure, fluctuation in output voltage due to leak current of the first clocked inverter can be reduced.

As shown in FIG. 4 of the example of prior art, the p-channel TFT 501*a* and p-channel TFT 501*b* of the first clocked inverter in each stage of the shift register can switch their positions. The p-channel TFT 501*a* has a gate electrode to which a clock pulse CK or an inverted clock pulse CKB is inputted. The p-channel TFT 501*b* has a gate electrode that serves as the input terminal of the first clocked inverter.

What exactly switching of positions of the above two TFTs means is defined here. For example, a first structure has a TFT1 and a TFT2 and a second structure is obtained by switching positions of the TFT1 and the TFT2. Signals inputted to respective gate electrodes of the TFT1 and TFT2 in the second structure are the same as those in the first structure. In the second structure, wiring is conducted so that a source electrode of the TFT1 has an electric connection relation which is identical with an electric connection relation of a source electrode of the TFT2 of the first structure, a source electrode of the TFT2 has an electric connection relation which is identical with an electric connection relation of a source electrode of the TFT1 of the first structure, a drain electrode of the TFT1 has an electric connection relation which identical with an electric connection relation of a drain electrode of the TFT2 of the first structure, and a drain electrode of the TFT2 has an electric connection relation which is identical with an electric connection relation of a drain electrode of the TFT1 of the first structure.

Also, the n-channel TFT 501*d* and n-channel TFT 501*c* of the first clocked inverter can switch their positions. The n-channel TFT 501*d* has a gate electrode to which a clock pulse CK or an inverted clock pulse CKB is inputted. The n-channel TFT 501*c* has a gate electrode that serves as the input terminal of the first clocked inverter.

In the same manner as above, the p-channel TFT 501*a* and p-channel TFT 501*b* of the second clocked inverter in each stage of the shift register can switch their positions. The p-channel TFT 501*a* has a gate electrode to which a clock pulse CK or an inverted clock pulse CKB is inputted. The p-channel TFT 501*b* has a gate electrode that serves as the input terminal of the second clocked inverter. Also, the n-channel TFT 501*d* and n-channel TFT 501*c* of the second clocked inverter can switch their positions. The n-channel TFT 501*d* has a gate electrode to which a clock pulse CK or an inverted clock pulse CKB is inputted. The n-channel TFT 501*c* has a gate electrode that serves as the input terminal of the second clocked inverter.

In FIG. 4, the TFTs constituting the first clocked inverter CKINV1, second clocked inverter CKINV2, and inverter INV of each stage of the shift register have a single gate structure. However, the TFTs are not limited thereto and may take a double gate structure or a multi-gate structure with more than two gate electrodes.

Embodiment 2

Figure 1:
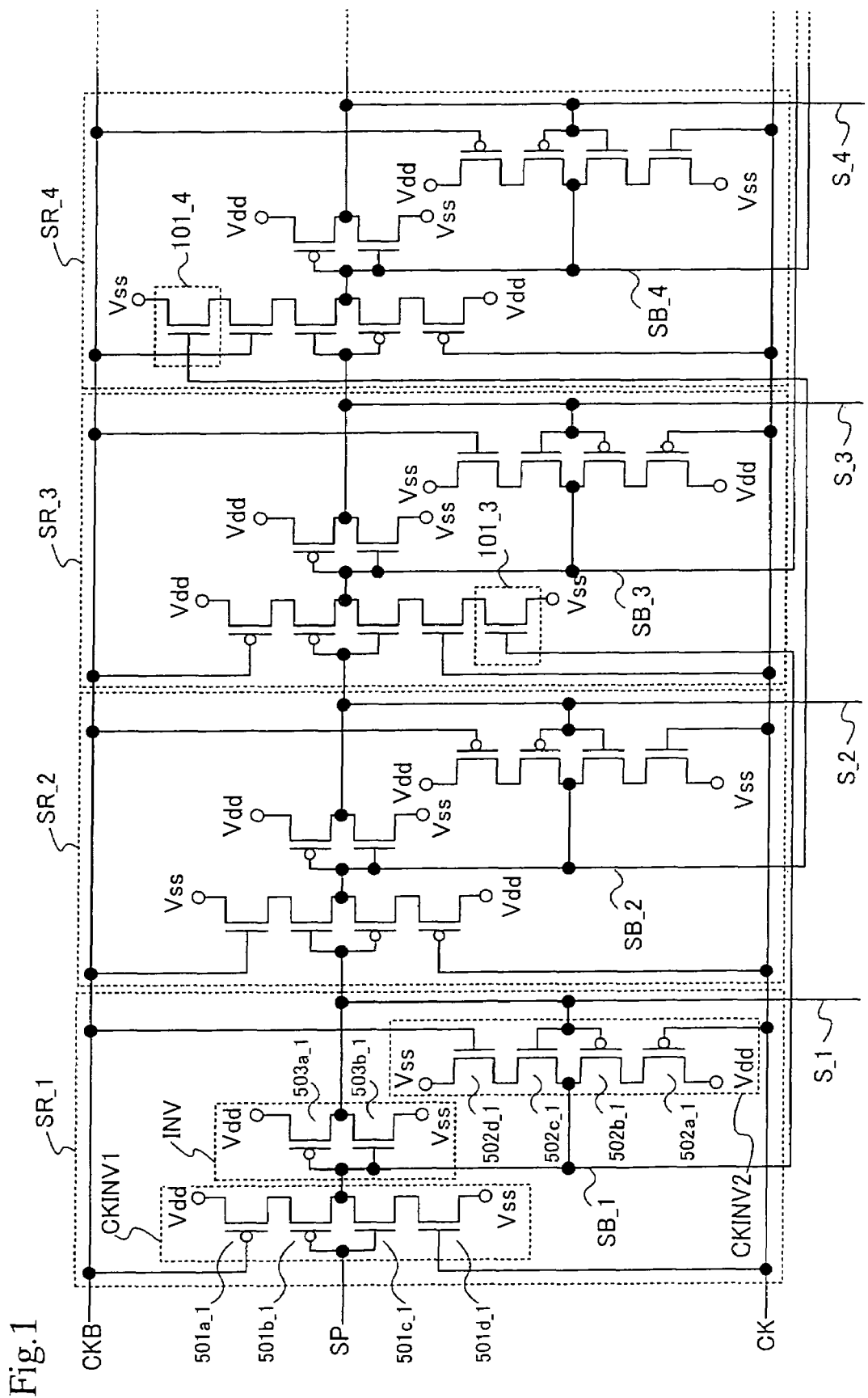
FIG. 1 is a circuit diagram showing the structure of a shift register according to the present invention.

FIG. 1 is a circuit diagram which shows the structure of a shift register in Embodiment 2. Components of this shift register that are identical with those in FIG. 4 are denoted by the same reference symbols and explanations thereof are omitted.

The shift register of the present invention receives a start pulse SP and clock pulse CK with a smaller amplitude voltage than the power supply voltage (corresponding to the electric potential difference between the high power supply electric potential Vdd and the low power supply electric potential Vss) of the shift register. The above causes leak current of a first clocked inverter. This embodiment reduces the leak current by the following structure.

In FIG. 1, an n-channel TFT 101 is added to the first clocked inverter CKINV1 in the third stage that constitutes the shift register and in each of the subsequent stages to the third stage. The n-channel TFT 101 in the k-th (k is a natural number equal to or larger than 3, and equal to or smaller than r) stage is denoted by 101_*k*.

A gate electrode of the n-channel TFT 101_*k* is connected to an output terminal of a first clocked inverter CKINV1_*k*–2 of the (k–2)-th stage. A source electrode of the n-channel TFT 101_*k* is connected to the low power supply electric potential Vss and a drain electrode thereof is connected to a source electrode of an n-channel TFT 501*d*_*k* of the first clocked inverter CKINV1_*k*.

With the above structure, a signal SB_*k*–2 is inputted to the gate electrode of the n-channel TRY 101_*k* in the first clocked inverter CKINV1_*k* of the k-th stage. When the n-channel TFT 501*d*_*k* should be turned OFF, the signal SB_*k*–2 is "Lo" electric potential. The "Lo" electric potential of the signal SB_*k*–2 is about the same level as the low power supply electric potential Vss. Therefore, when the "Lo" electric potential of the signal SB_*k*–2 is inputted to the gate electrode of the n-channel TFT 501*d*_*k*, the n-channel TFT 501*d*_*k* obtains a gate voltage (a gate-source voltage $V_{gs}$) of about 0 V and is turned OFF without fail. In this way, the leak current of n-channel TFTs can be avoided in the first clocked inverter CKINV1_*k* of the k-th stage circuit.

Figure 2:
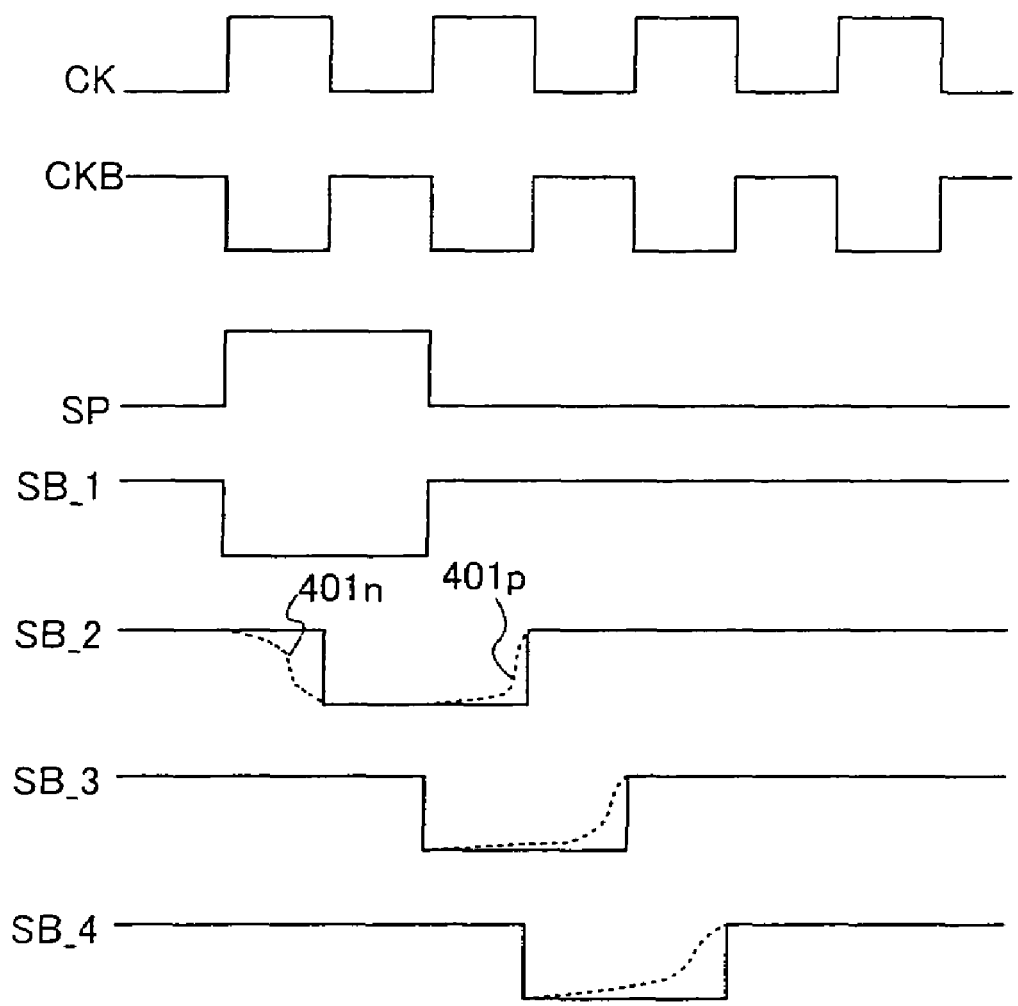
FIG. 2 is a timing chart showing a method of driving a shift register according to the present invention.

FIG. 2 is a timing chart for driving the shift register of FIG. 1.

The fluctuation in output SB_1 of the first clocked inverter of the first stage due to the leak current is not a problem if a start pulse SP is inputted in the manner shown in the timing chart. In other words, in the first docked inverter of the first stage, the fluctuation in output SB_1 of the first clocked inverter of the first stage due to the leak current is not a problem if the output SB_1 of the first clocked inverter CKINV1_1 of the first stage is a signal obtained by inverting the polarity of the inputted start pulse SP.

The output SB_2 of the first clocked inverter of the second stage is fluctuated due to the leak current. On the other hand, the structure of this embodiment is capable of preventing the outputs SB of the first clocked inverters in the third stage and its subsequent stages from being fluctuated due to the leak current of n-channel TFTs. Accordingly, outputs of the third stage and its subsequent stages are regarded as the legitimate outputs of the shift register.

As described above, by adding the n-channel TFT 101 to the first clocked inverter CKINV1 in the third stage and each of its subsequent stages, the leak current is prevented and the shift register can operate normally.

Now, a different type of shift register is described with reference to FIG. 12. This shift register outputs a signal obtained from NAND operation of output signals S of adjacent stages. Outputs S of the respective stages are electric potentials of those shown in FIG. 1. Components of this shift register that are identical with those in FIG. 1 are denoted by the same reference symbols and explanations thereof are omitted.

The fluctuation in output SB_1 of the first clocked inverter CKINV1_1 of the first stage due to the leak current is not a problem if a start pulse SP is inputted in the manner shown in the timing chart. Although the output SB_2 of the first clocked inverter of the second stage fluctuates due to the leak current, the fluctuation does not interfere with operation of the shift register since a signal obtained from NAND operation of the outputs S_1 and S_2 of the first and second stages is output as a sampling pulse SMP_1. By adding the n-channel TFT 101 to the first clocked inverter CKINV1 in the third stage and each of its subsequent stages, the leak current is prevented and the shift register can operate normally.

Note that, no new p-channel TFT for preventing the leak current of the p-channel TFT without fail is added in this embodiment. Generally, n-channel TFTs have better characteristics than p-channel TFTs, and therefore, it is important to ensure prevention of leak current of n-channel TFT in particular. Accordingly, the above structure for preventing leak current is very effective.

In the first and second stages of the shift register of this embodiment, the p-channel TFTs 501a and 501b of the first clocked inverter CKINV1 thereof can switch their positions. To elaborate, one structure that can be employed sets, as a p-channel TFT 501a, a TFT that has a source electrode connected to the high power supply electric potential Vdd, as shown in FIGS. 1 and 12. In this case, the p-channel TFT 501a is serially connected to a p-channel TFT 501b in this order and a drain electrode of the p-channel TFT 501b serves as the output terminal of the first clocked inverter CKINV1. Another structure that can be employed sets, as a p-channel TFT 501b, a TFT that has a source electrode connected to the high power supply electric potential Vdd. In this case, the p-channel TFT 501b is serially connected to a p-channel TFT 501a in this order and a drain electrode of the p-channel TFT 501a serves as the output terminal of the first clocked inverter CKINV1.

As has been mentioned in the above, there are two ways to place p-channel TFTs 501a and 501b in the first clocked inverter CKINV1. In each of the two ways of placement, n-channel TFTs 501d and 501c can switch their positions. To elaborate, one structure that can be employed sets, as an n-channel TFT 501d, a TFT that has a source electrode connected to the low power supply electric potential Vss, as shown in FIGS. 1 and 12. In this case, the n-channel TFT 501d is serially connected to the n-channel TFT 501c in this order and a drain electrode of the n-channel TFT 501c serves as the output terminal of the first clocked inverter CKINV1. Another structure that can be employed sets, as an n-channel TFT 501c, a TFT that has a source electrode connected to the low power supply electric potential Vss, and the n-channel TFT 501c is serially connected to the n-channel TFT 501d in this order and a drain electrode of the n-channel TFT 501d serves as the output terminal of the first clocked inverter CKINV1.

In the first stage circuit and the second stage circuit, similarly to the first clocked inverter CKINV1, the p-channel TFTs 501a and 501b of the second clocked inverter CKINV2 can switch their positions. The n-channel TFTs 501d and 501c of the second clocked inverter CKINV2 can also switch their positions.

In the third stage circuit of the shift register in this embodiment and the circuit in each of the subsequent stages to the third stage, the p-channel TFTs 501a and 501b of the first clocked inverter CKINV1 thereof can switch their positions. To elaborate, one structure that can be employed sets, as a p-channel TFT 501a, a TFT that has a source electrode connected to the high power supply electric potential Vdd, as shown in FIGS. 1 and 12. In this case, the p-channel TFT 501a is serially connected to a p-channel TFT 501b in this order and a drain electrode of the p-channel TFT 501b serves as the output terminal of the first clocked inverter CKINV1. Another structure that can be employed sets, as a p-channel TFT 501b, a TFT that has a source electrode connected to the high power supply electric potential Vdd. In this case, the p-channel TFT 501b is serially connected to a p-channel TFT 501a in this order and a drain electrode of the p-channel TFT 501a serves as the output terminal of the first clocked inverter CKINV1.

As has been mentioned in the above, there are two ways to place p-channel TFTs 501a and 501b in the first clocked inverter CKINV1. In each of the two ways of placement. n-channel TFTs 101, 501d, and 501c can switch their positions. To elaborate, one structure that can be employed sets, as an n-channel TFT 101, a TFT that has a source electrode connected to the low power supply electric potential Vss, as shown in FIGS. 1 and 12. In this case, the n-channel TFT 101 is serially connected to n-channel TFTs 501d and 501c in this order and a drain electrode of the n-channel TFT 501c serves as the output terminal of the first clocked inverter CKINV1. Another structure that can be employed sets, as an n-channel TFT 101, a TFT that has a source electrode connected to the low power supply electric potential Vss. In this case, the n-channel TFT 101 is serially connected to n-channel TFTs 501c and 501d in this order and a drain electrode of the n-channel TFT 501d serves as the output terminal of the first clocked inverter CKINV1. Still another structure that can be employed sets, as an n-channel TFT 501d, a TFT that has a source electrode connected to the low power supply electric potential Vss. In this case, the n-channel TFT 501d is serially connected to n-channel TFTs 101 and 501c in this order and a drain electrode of the n-channel TFT 501c serves as the output terminal of the first clocked inverter CKINV1. Yet still another structure that can be employed sets, as an n-channel TFT 501c, a TFT that has a source electrode connected to the low power supply electric potential Vss. In this case, the n-channel TFT 501c is serially connected to n-channel TFTs 101 and 501d in this order and a drain electrode of the n-channel TFT 501d serves as the output terminal of the first clocked inverter CKINV1. Yet still another structure that can be employed sets, as an n-channel TFT 501d, a TFT that has a source electrode connected to the low power supply electric potential Vss. In this case, the n-channel TFT 501d is serially connected to n-channel TFTs 501c and 101 in this order and a drain electrode of the n-channel TFT 101 serves as the output terminal of the first clocked inverter CKINV1. Yet still another structure that can be employed sets, as an n-channel TFT 501c, a TFT that has a source electrode connected to the low power supply electric potential Vss. In this case, the n-channel TFT 501c is serially connected to n-channel TFTs 501d and 101 in this order and a drain electrode of the n-channel TFT 101 serves as the output terminal of the first clocked inverter CKINV1.

Similarly to the second clocked inverter CKINV2 in the first and the second stages, the p-channel TFTs 501a and 501b of the second clocked inverter CKINV2 in the third stage or each of its subsequent stages can switch their positions. The n-channel TFTs 501d and 501c of the second clocked inverter CKINV2 can also switch their positions.

Figure 12:
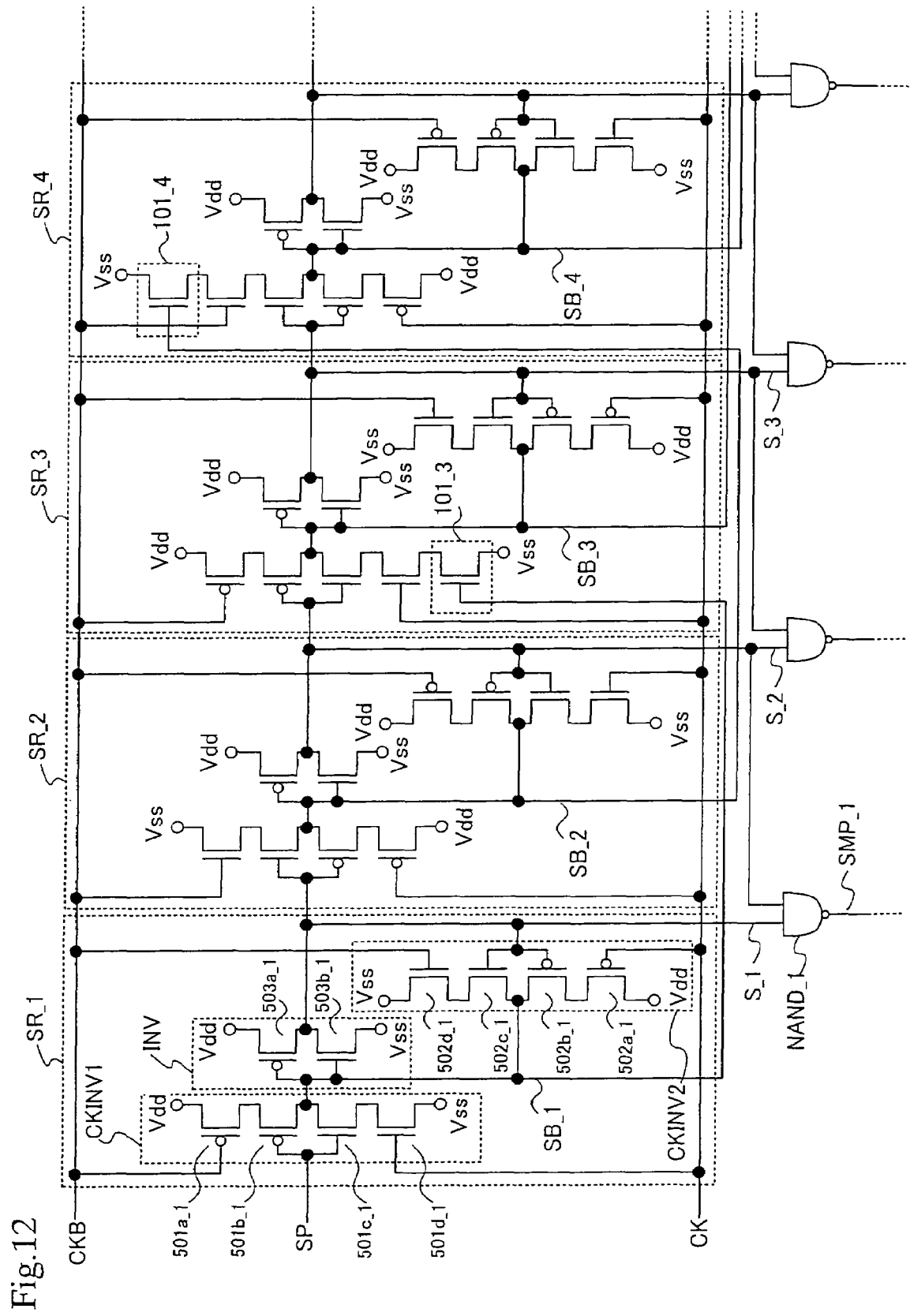
FIG. 12 is a circuit diagram showing the structure of a shift register according to the present invention.

In FIGS. 1 and 12, the TFTs constituting the first clocked inverter CKINV1, second clocked inverter CKINV2, and inverter INV of each stage of the shift register have a single gate structure. However, the TFTs are not limited thereto and may take a double gate structure or a multi-gate structure with more than two gate electrodes.

This embodiment may be combined freely with Embodiment 1.

Embodiment 3

Figure 8:
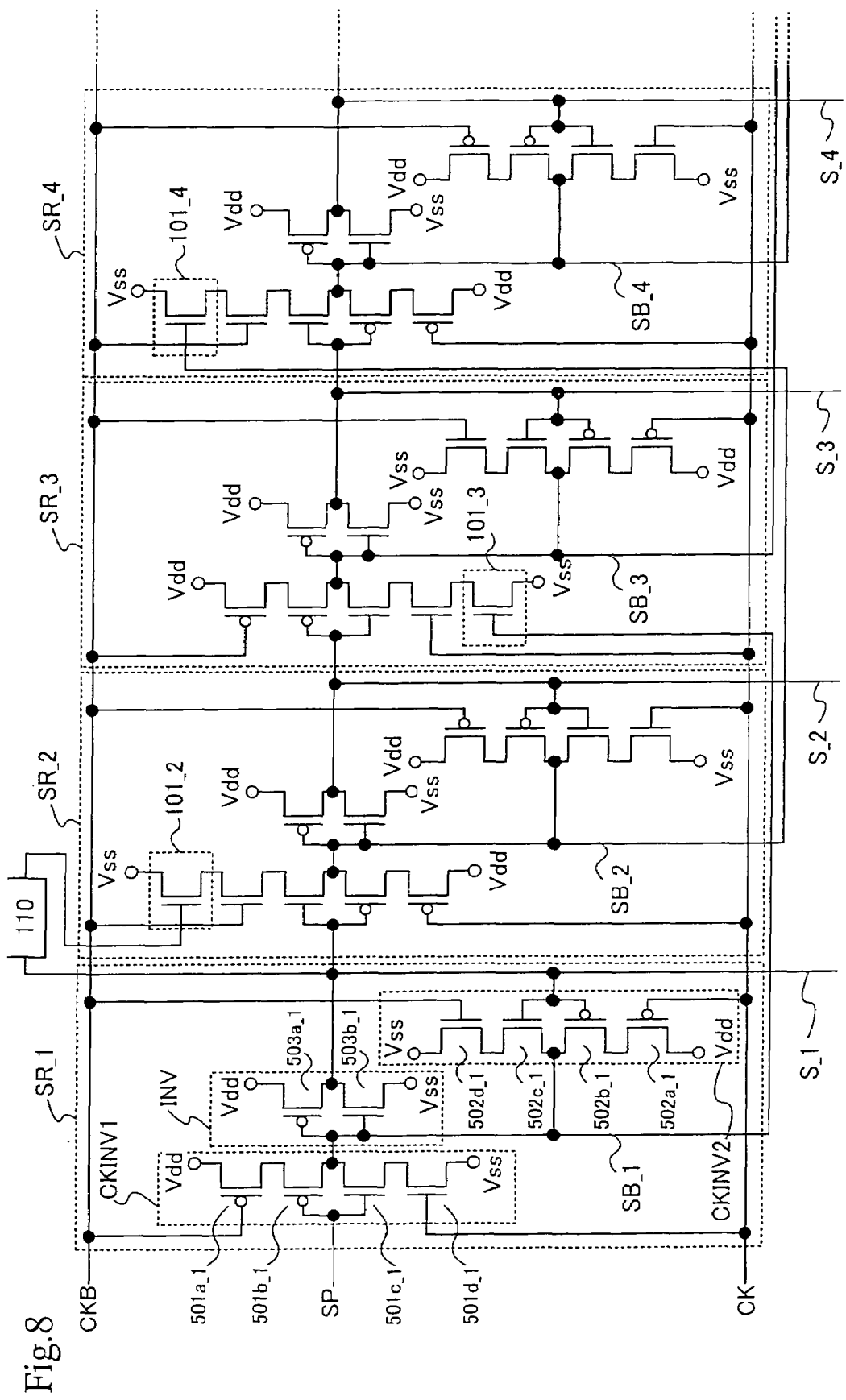
FIG. 8 is a circuit diagram showing the structure of a shift register according to the present invention.

This embodiment describes a shift register structured differently from Embodiment 2 illustrated in FIG. 1. The description will be given with reference to FIG. 8. In FIG. 8, identical components with those in FIG. 1 are denoted by the same reference symbols and explanations thereof will be omitted.

The shift register of the present invention receives a start pulse SP and clock pulse CK with a smaller amplitude voltage than the power supply voltage (corresponding to the electric potential difference between the high power supply electric potential Vdd and the low power supply electric potential Vss) of the shift register. The above causes a leak current of a first clocked inverter. This embodiment reduces the leak current by the following structure.

In FIG. 8, the n-channel TFT 101 is added to the first clocked inverter CKINV1 in the second stage that constitutes the shift register and in each of the subsequent stages to the second stage. The n-channel TFT 101 in the k-th (k is a natural number equal to or larger than 2, and equal to or smaller than r) stage is denoted by 101_k.

A gate electrode of the n-channel TFT 101_k is connected to an output terminal of the first clocked inverter CKINV1_k–2 of the (k–2)-th stage. A source electrode of the n-channel TFT 101_k is connected to the low power supply electric potential Vss and a drain electrode thereof is connected to a source electrode of the n-channel TFT 501d_k of the first clocked inverter CKINV1_k.

A source electrode of an n-channel TFT 101_2 added to the second stage is connected to the low power supply electric potential Vss and a drain electrode thereof is connected to a source electrode of a first n-channel TFT 501d_2 of a first clocked inverter CKINV1_2.

In FIG. 8, the output of an inverter INV_1 of the first stage is inputted to a gate electrode of the n-channel TFT 101_2 of the second stage through a delay circuit 110. The delay circuit 110 is composed of a plurality of inverter circuits connected longitudinally. However, the present invention is not limited thereto and a circuit with any known structure can be used freely as the delay circuit 110.

With the above structure, a signal obtained by delaying the output S_1 of the first stage (the output of the inverter INV_1 of the first stage) is inputted to the gate electrode of the n-channel TFT 101_2 in the first clocked inverter CKINV1_2 of the second stage when the n-channel TFT is to be turned OFF. The signal is inputted after being delayed by about half a cycle of clock pulse. The leak current of n-channel TFTs is thus prevented from flowing in the first clocked inverter CKINV1_2 of the second stage circuit.

The gate electrode of the n-channel TFT 101_2 can receive other signals which are not the signal obtained by delaying the output S_1 of the inverter INV_1 of the first stage by about half a cycle of clock pulse. For example, a signal obtained by inverting the polarity of the output SB_1 of the first clocked inverter CKINV1_1 of the first stage and then delaying may be input.

A signal inputted to the gate electrode of the n-channel TFT 101_2 is not limited to the above signals as long as the n-channel TFT 101_2 is turned OFF when the leak current of n-channel TFTs causes a problem, and as long as the n-channel TFT 101_2 is turned ON when the n-channel TFTs 501c and 501d of the second stage are both to be turned ON.

In the first clocked inverter of the k-th (k=3 or larger) stage circuit, the n-channel TFT 101_k is turned OFF by inputting a signal SB_k–2 to the gate electrode of the n-channel TFT 101_k when the n-channel TFT 501d_k is to be turned OFF. The leak current of n-channel TFTs is thus prevented from flowing in the first clocked inverter CKINV1_k of the k-th stage circuit.

The fluctuation in output SB_1 of the first clocked inverter of the first stage due to the leak current is not a problem if a start pulse SP is inputted in the manner shown in the timing chart. In other words, in the first clocked inverter of the first stage the fluctuation in output SB_1 of the first clocked inverter of the first stage due to the leak current is not a problem if the output SB_1 of the first clocked inverter CKINV1_1 of the first stage is a signal obtained by inverting the polarity of the inputted start pulse SP.

Therefore, by adding the n-channel TFT 101 to the first clocked inverter CKINV1 in the second stage and each of its subsequent stages, the leak current is prevented and the shift register can operate normally.

Figure 9:
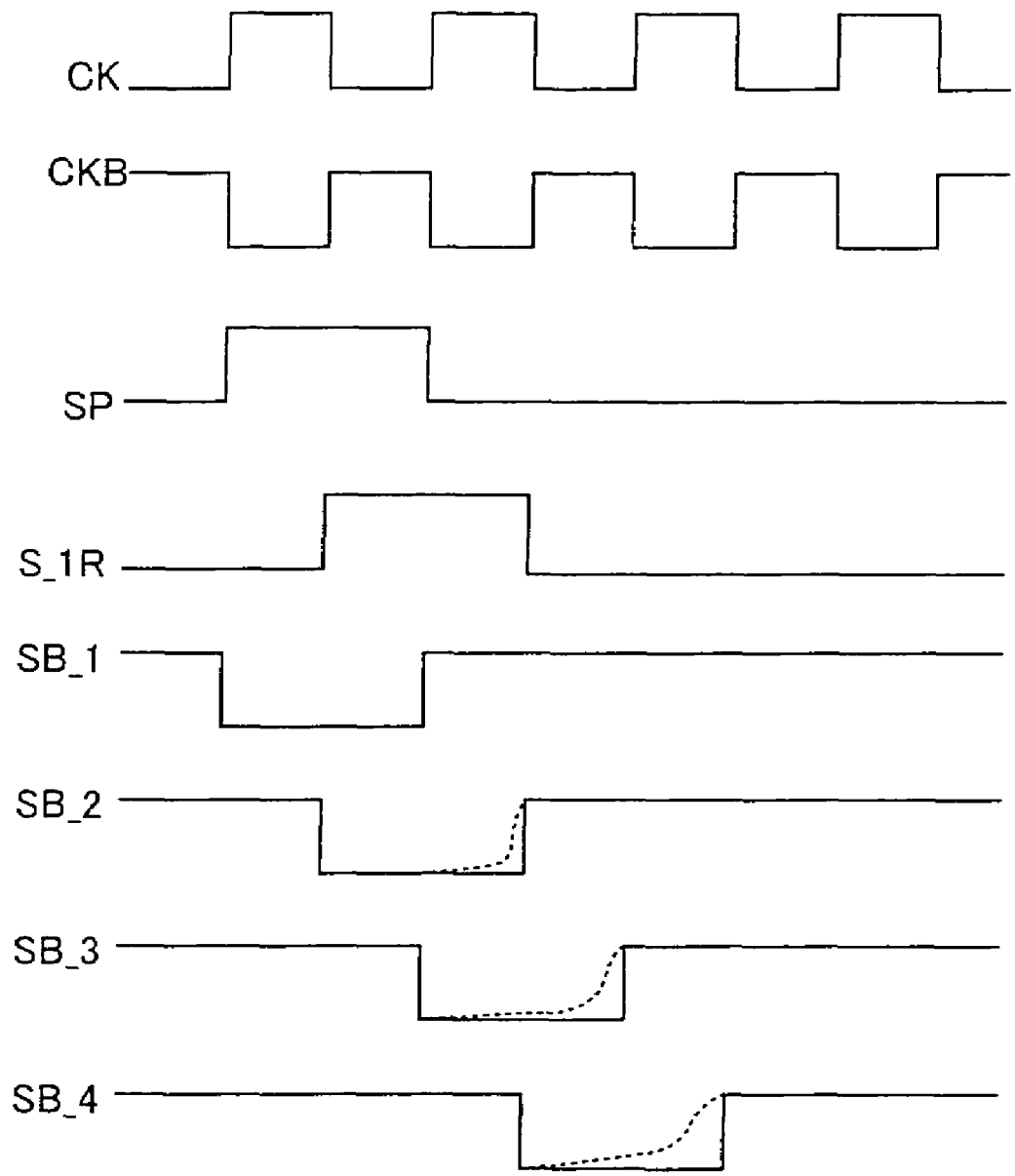
FIG. 9 is a timing chart showing a method of driving a shift register according to the present invention.
Figure 10:
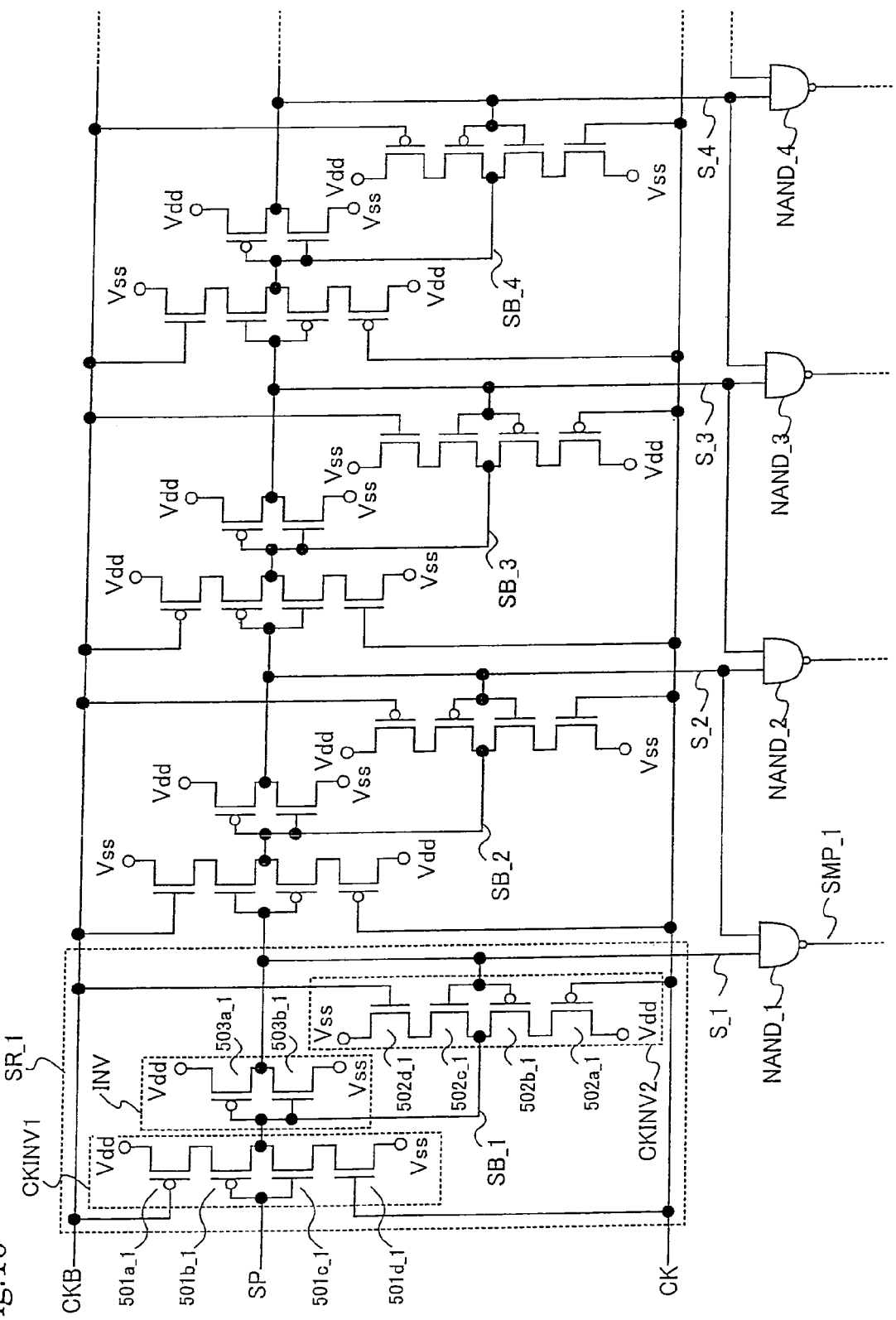
FIG. 10 is a circuit diagram showing the structure of a shift register.
Figure 11:
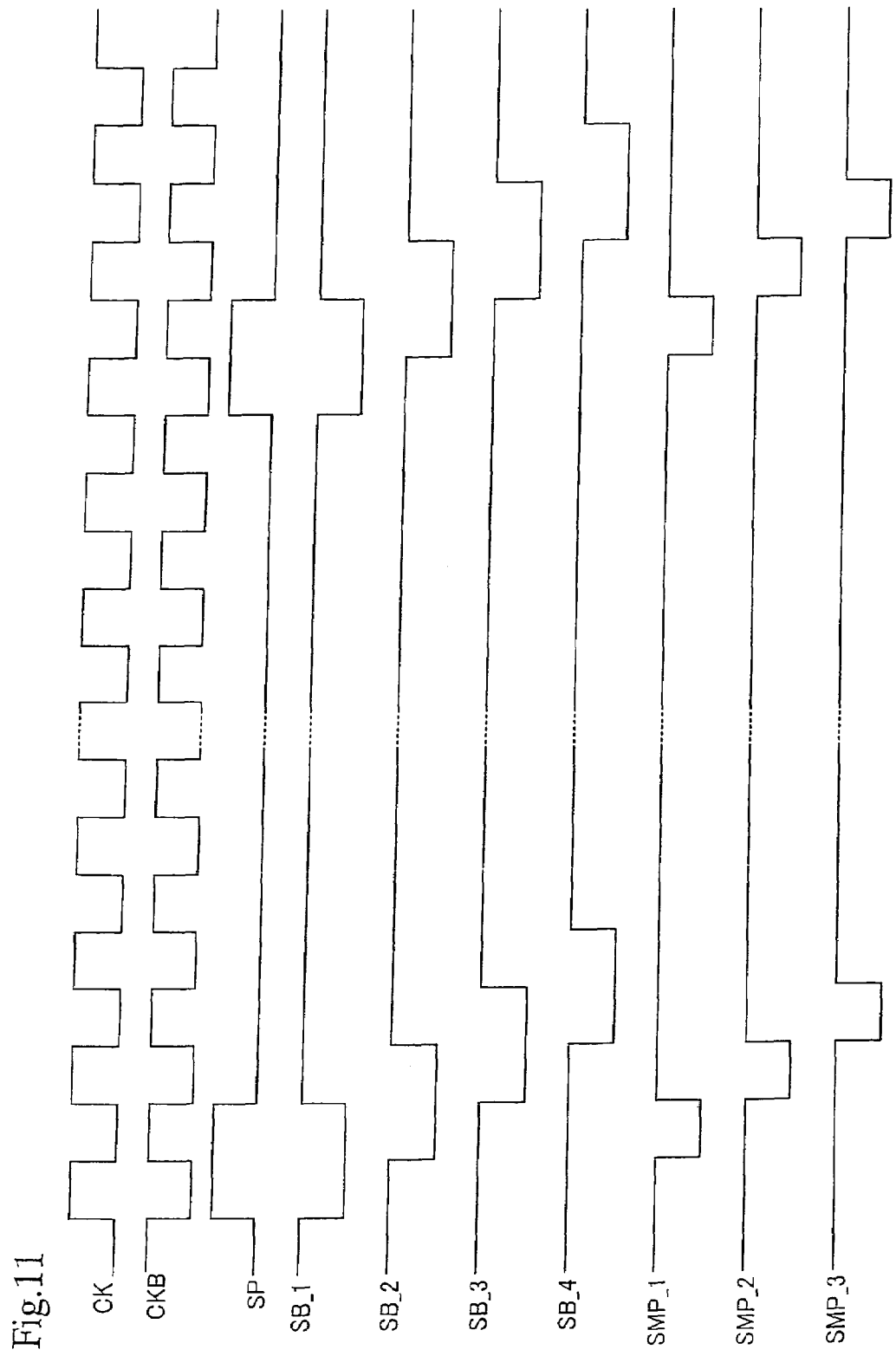
FIG. 11 is a timing chart showing a method of driving a shift register according to the present invention.

A method of driving the shift register according to this embodiment is described with reference to a timing chart of FIG. 9. FIG. 9 shows a signal S_1R that is inputted to the gate electrode of the TFT 101_2 through the delay circuit 110. The TFT 101_2 is turned OFF by the signal S_1R to avoid the leak current of the first clocked inverter CKINV1_2 of the second stage.

No new p-channel TFT is added for preventing the leak current of the p-channel TFT without fail. Generally, n-channel TFTs have better characteristics than p-channel TFTs, and therefore, it is important to ensure prevention of leak current of n-channel TFT in particular. Accordingly, the above structure for preventing leak current is very effective.

In the first stage of the shift register of this embodiment, the p-channel TFTs 501a and 501b of the first clocked inverter CKINV1_1 can switch their positions. To elaborate, one structure that can be employed sets, as a p-channel TFT 501a, a TFT that has a source electrode connected to the high power supply electric potential Vdd, as shown in FIG. 8. In this case, the p-channel TFT 501a is serially connected to a p-channel TFT 501b in this order and a drain electrode of the p-channel TFT 501b serves as the output terminal of the first clocked inverter CKINV1_1. Another structure that can be employed sets, as a p-channel TFT 501b, a TFT that has a source electrode connected to the high power supply electric potential Vdd. In this case, the p-channel TFT 501*b* is serially connected to a p-channel TFT 501*a* in this order and a drain electrode of the p-channel TFT 501*a* serves as the output terminal of the first clocked inverter CKINV1_1.

As has been mentioned in the above, there are two ways to place p-channel TFTs 501*a* and 501*b* in the first clocked inverter CKINV1_1. In each of the two ways of placement, n-channel TFTs 501*d* and 501*c* can switch their positions. To elaborate, one structure that can be employed sets, as an n-channel TFT 501*d*, a TFT that has a source electrode connected to the low power supply electric potential Vss, as shown in FIG. 8. In this case, the n-channel TFT 501*d* is serially connected to the n-channel TFT 501*c* in this order and a drain electrode of the n-channel TFT 501*c* serves as the output terminal of the first clocked inverter CKINV1_1. Another structure that can be employed sets, as an n-channel TFT 501*c*, a TFT that has a source electrode connected to the low power supply electric potential Vss. In this case, the n-channel TFT 501*c* is serially connected to the n-channel TFT 501*d* in this order and a drain electrode of the n-channel TFT 501*d* serves as the output terminal of the first clocked inverter CKINV1_1.

In the first stage circuit, similarly to the first clocked inverter CKINV1_1 the p-channel TFTs 501*a* and 501*b* of the second clocked inverter CKINV2_1 can switch their positions. The n-channel TFTs 501*d* and 501*c* of the second clocked inverter CKINV2_1 can also switch their positions.

In the second stage circuit of the shift register of this embodiment and the circuit in each of the subsequent stages to the second stage, the p-channel TFTs 501*a* and 501*b* of the first clocked inverter CKINV1 thereof can switch their positions. To elaborate, one structure that can be employed sets, as a p-channel TFT 501*a*, a TFT that has a source electrode connected to the high power supply electric potential Vdd, as shown in FIG. 8. In this case, the p-channel TFT 501*a* is serially connected to a p-channel TFT 501*b* in this order and a drain electrode of the p-channel TFT 501*b* serves as the output terminal of the first clocked inverter CKINV1. Another structure that can be employed sets, as a p-channel TFT 501*b*, a TFT that has a source electrode connected to the high power supply electric potential Vdd. In this case, the p-channel TFT 501*b* is serially connected to a p-channel TFT 501*a* in this order and a drain electrode of the p-channel TFT 501*a* serves as the output terminal of the first clocked inverter CKINV1.

As has been mentioned in the above, there are two ways to place p-channel TFTs 501*a* and 501*b* in the first clocked inverter CKINV1. In each of the two ways of placement, n-channel TFTs 101, 501*d*, and 501*c* can switch their positions. To elaborate, one structure that can be employed sets, as an n-channel TFT 101, a TFT that has a source electrode connected to the low power supply electric potential Vss, as shown in FIG. 8. In this case, the n-channel TFT 101 is serially connected to n-channel TFTs 501*d* and 501*c* in this order and a drain electrode of the n-channel TFT 501*c* serves as the output terminal of the first clocked inverter CKINV1. Another structure that can be employed sets, as an n-channel TFT 101, a TFT that has a source electrode connected to the low power supply electric potential Vss. In this case, the n-channel TFT 101 is serially connected to n-channel TFTs 501*c* and 501*d* in this order and a drain electrode of the n-channel TFT 501*d* serves as the output terminal of the first clocked inverter CKINV1. Still another structure that can be employed sets, as an n-channel TFT 501*d*, a TFT that has a source electrode connected to the low power supply electric potential Vss. In this case, the n-channel TFT 501*d* is serially connected to n-channel TFTs 101 and 501*c* in this order and a drain electrode of the n-channel TFT 501*c* serves as the output terminal of the first clocked inverter CKINV1. Yet still another structure that can be employed sets, as an n-channel TFT 501*c*, a TFT that has a source electrode connected to the low power supply electric potential Vss. In this case, the n-channel TFT 501*c* is serially connected to n-channel TFTs 101 and 501*d* in this order and a drain electrode of the n-channel TFT 501*d* serves as the output terminal of the first clocked inverter CKINV1. Yet still another structure that can be employed sets, as an n-channel TFT 501*d*, a TFT that has a source electrode connected to the low power supply electric potential Vss. In this case, the n-channel TFT 501*d* is serially connected to n-channel TFTs 501*c* and 101 in this order and a drain electrode of the n-channel TFT 101 serves as the output terminal of the first clocked inverter CKINV1. Yet still another structure that can be employed sets, as an n-channel TFT 501*c*, a TFT that has a source electrode connected to the low power supply electric potential Vss. In this case, the n-channel TFT 501*c* is serially connected to n-channel TFTs 501*d* and 101 in this order and a drain electrode of the n-channel TFT 101 serves as the output terminal of the first clocked inverter CKINV1.

Similarly to the second clocked inverter CKINV2_1 in the first stage circuit, the p-channel TFTs 501*a* and 501*b* of the second clocked inverter CKINV2 in the second stage and each of the subsequent stage to the second stage, can switch their positions. The n-channel TFTs 501*d* and 501*c* of the second clocked inverter CKINV2 can also switch their positions.

In FIG. 8, the TFTs constituting the first clocked inverter CKINV1, second clocked inverter CKINV2, and inverter INV of each stage of the shift register have a single gate structure. However, the TFTs are not limited thereto and may take a double gate structure or a multi-gate structure with more than two gate electrodes.

This embodiment may be combined freely with Embodiment 1.

Embodiment 4

This embodiment describes a shift register structured differently from Embodiment 2 or 3.

Figure 18:
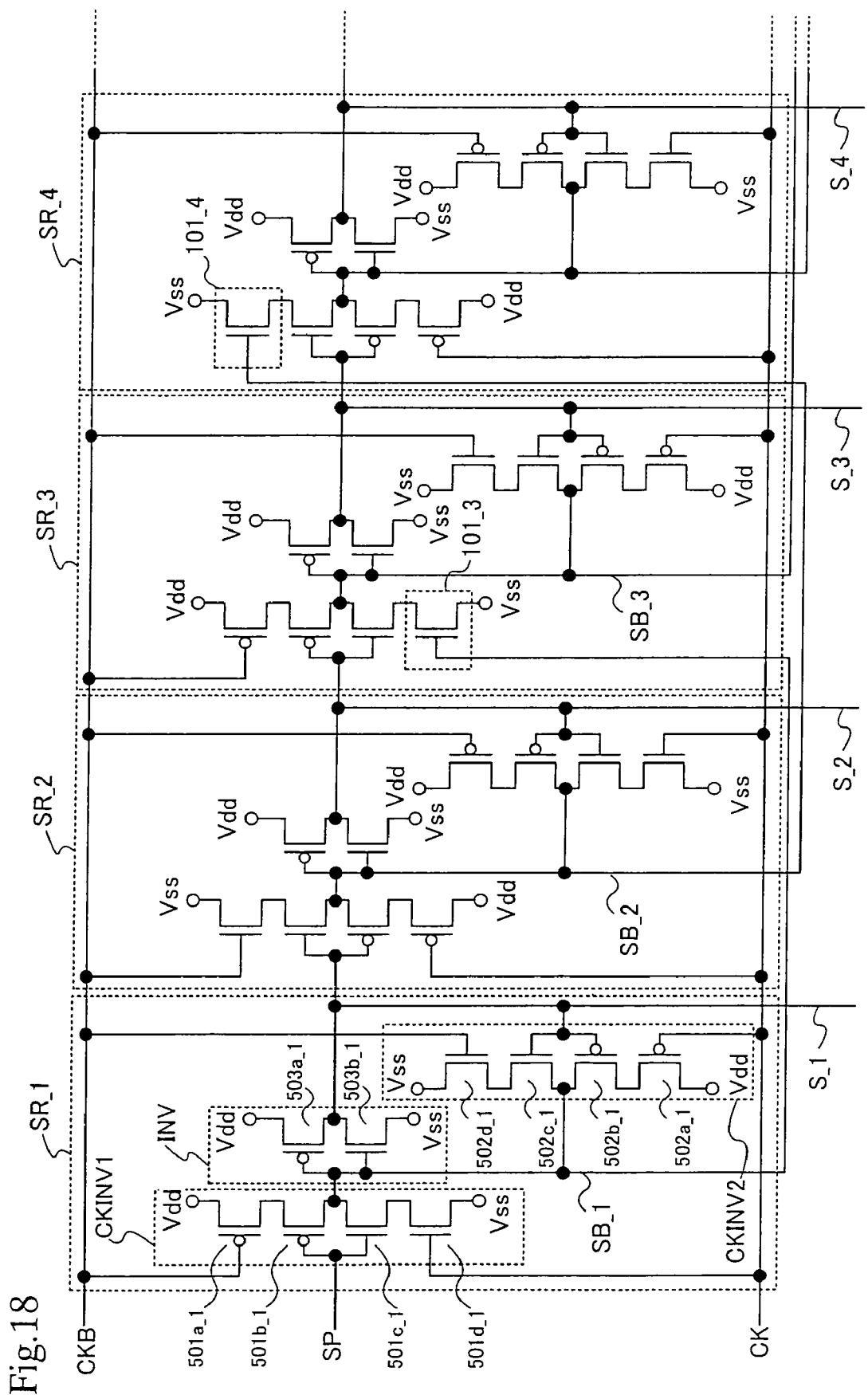
FIG. 18 is a circuit diagram showing the structure of a shift register according to the present invention.

The shift register of this embodiment is a modification of the shift register structured as shown in FIG. 1, and is obtained by removing the n-channel TFT 501*d* to which a clock pulse CK or an inverted clock pulse CKB is inputted, from each of the third stage and its subsequent stages that have the n-channel TFT 101 in the first clocked inverter CKINV1. The structure of the shift register of this embodiment is shown in FIG. 18. Components of this shift register that are identical with those in FIG. 1 are denoted by the same reference symbols and explanations thereof are omitted. For example, the first clocked inverter CKINV1 of the third stage in FIG. 18 does not have the n-channel TFT 501*d*_3 of FIG. 1. The timing of outputting pulses of the shift register structured as shown in FIG. 18 is the same as the shift register structured as shown in FIG. 1.

The structure shown in FIG. 18 has the same number of TFTs that constitute the shift register as a conventional shift register has. However, the structure of FIG. 18 can reduce fluctuation in output electric potential of the first clocked inverter due to the leak current when the shift register receives a clock pulse and start pulse with a smaller amplitude voltage than the power supply voltage of the shift register. Thus obtained is a shift register which operates at high frequency with less power consumption and which is free from the problems such as noises of power supply lines and a large area for placement.

Figure 19:
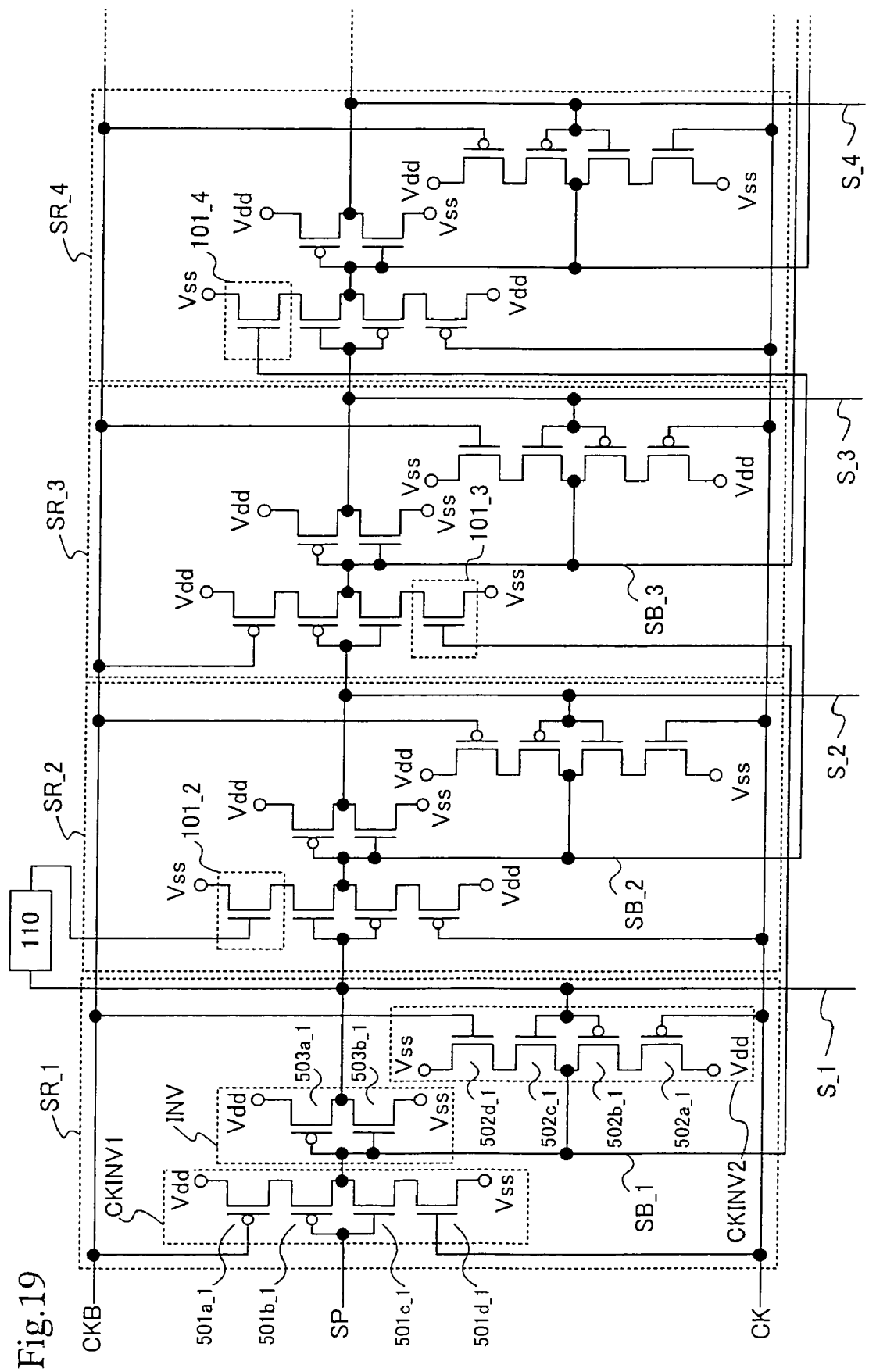
FIG. 19 is a circuit diagram showing the structure of a shift register according to the present invention.

The shift register structured as shown in FIG. 8 can be modified to obtain a different structure by removing the n-channel TFT 501d to which a clock pulse CK or an inverted clock pulse CKB is inputted, from each of the second stage and its subsequent stages that have the n-channel TFTs 101 in the first clocked inverter CKINV1. This structure is shown in FIG. 19. Components of this shift register that are identical with those in FIG. 8 are denoted by the same reference symbols and explanations thereof are omitted. For example, the first clocked inverter CKINV1 of the second stage in FIG. 19 does not have the n-channel TFT 501d_2 of FIG. 8. The timing of outputting pulses of the shift register structured as shown in FIG. 19 is the same as the shift register structured as shown in FIG. 8.

The structure shown in FIG. 19 also has the same number of TFTs that constitute the shift register as a conventional shift register has. However, the structure of FIG. 19 can reduce fluctuation in output electric potential of the first clocked inverter due to the leak current when the shift register receives a clock pulse and start pulse with a smaller amplitude voltage than the power supply voltage of the shift register. Thus obtained is a shift register which operates at high frequency with less power consumption and which is free from the problems such as noises of power supply lines and a large area for placement.

This embodiment may be combined freely with any of Embodiments 1 to 3.

Embodiment 5

This embodiment shows an example of a shift register, to which a start pulse SP and clock pulse CK with a smaller amplitude voltage than power supply voltage (corresponding to electric potential difference between the high power supply electric potential Vdd and the low power supply electric potential Vss) of the shift register are inputted, and which uses the following structure to reduce leak current of a first clocked inverter due to inputting these pulses.

The shift register in this embodiment is structured so that leak current flowing through p-channel TFTs 501a and 501b of a first clocked inverter is reduced.

Figure 20:
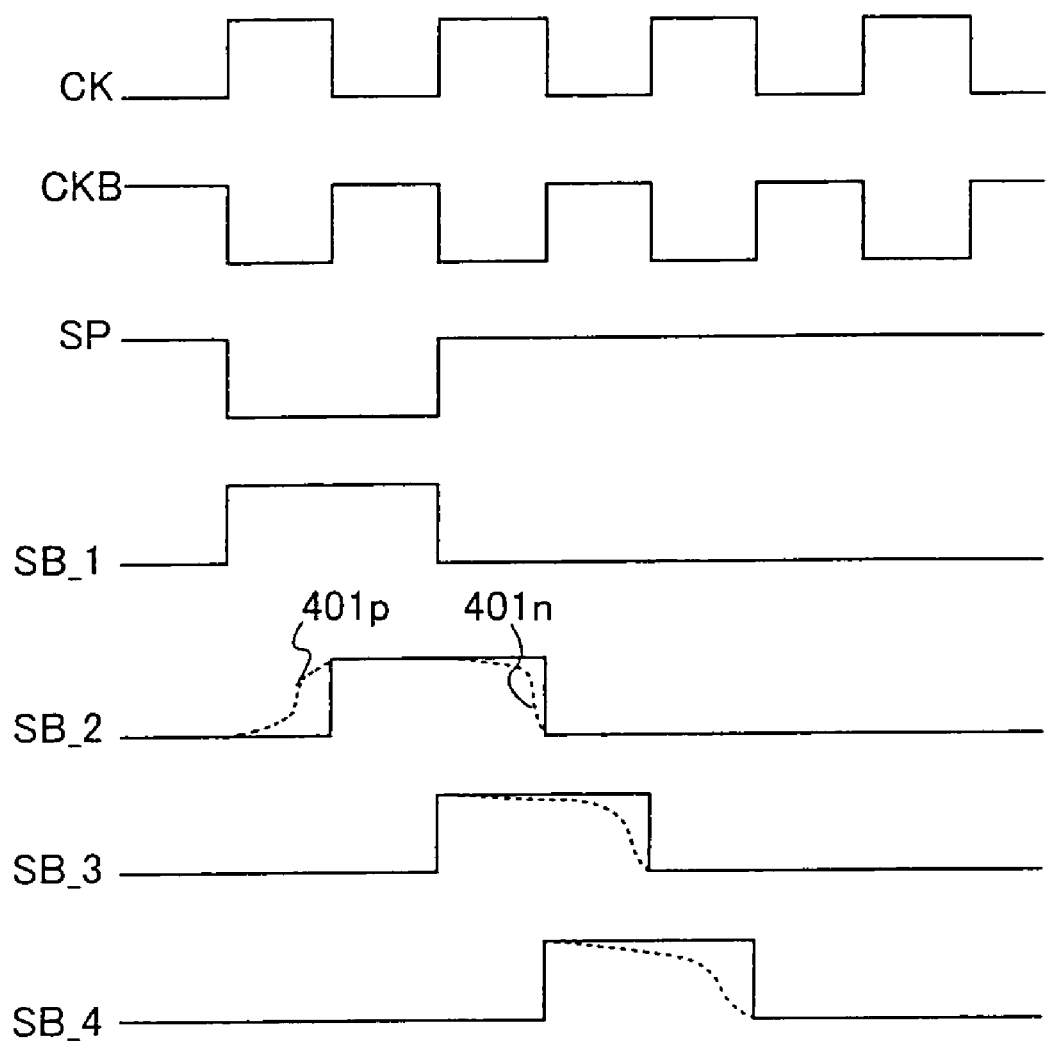
FIG. 20 is a timing chart showing a method of driving a shift register according to the present invention.
Figure 21:
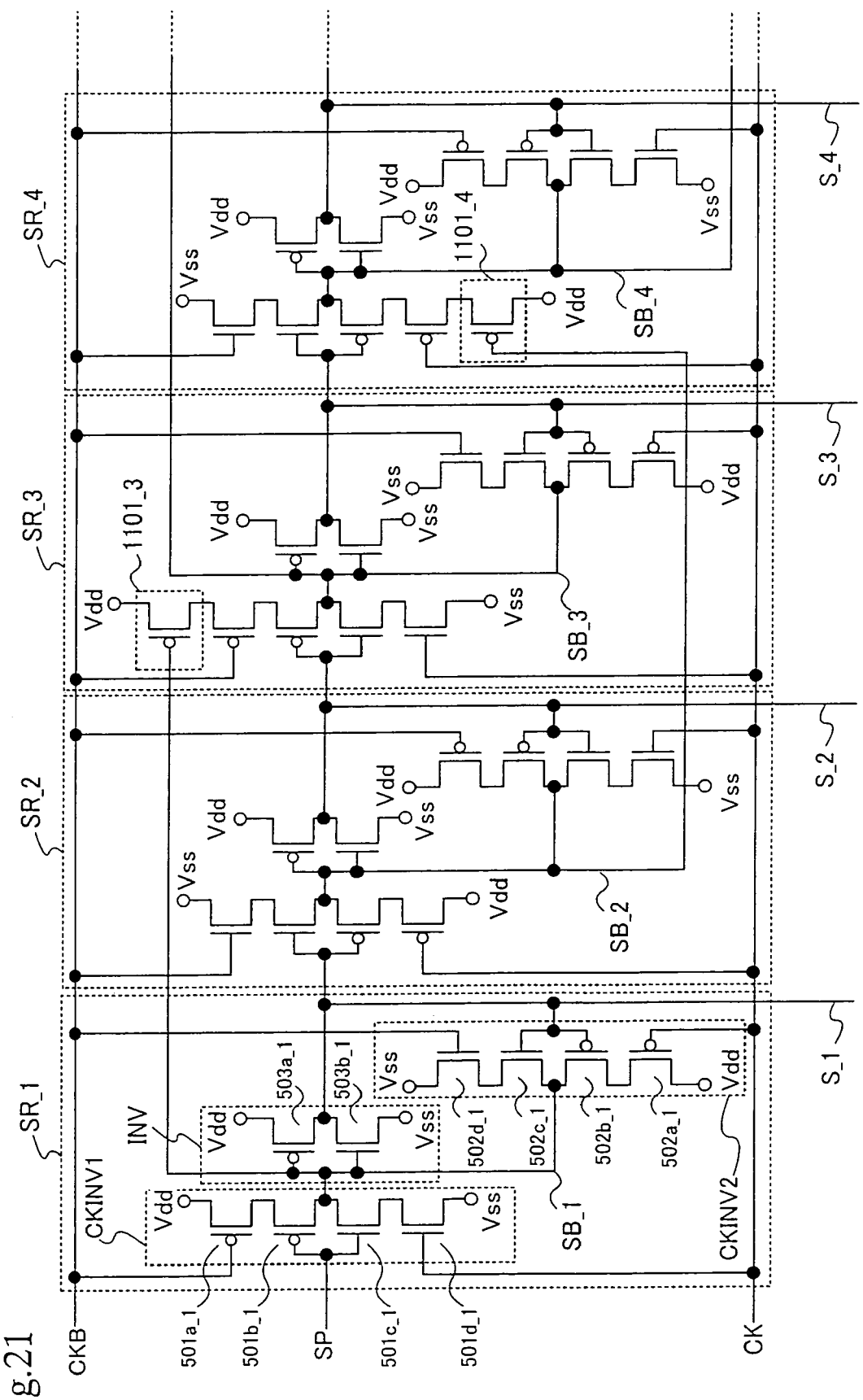
FIG. 21 is a circuit diagram showing the structure of a shift register according to the present invention.

FIG. 21 shows the structure of the shift register of this embodiment. FIG. 20 is a timing chart of the shift register shown in FIG. 21. The timing for inputting a start pulse SP and clock pulse CK here is similar to that for the shift register shown in FIG. 1 in Embodiment 1, and therefore, a detailed description is omitted.

However, the polarity of a start pulse inputted to the shift register structured as shown in FIG. 21 of this embodiment is reverse to the polarity of a start pulse inputted to the shift register structured as shown in FIG. 1 of Embodiment 1. The shift register of FIG. 21 and the shift register of FIG. 1 receive the same clock pulse CK and inverted clock pulse CKB.

In the shift register shown in FIG. 21, the first clocked inverter CKINV1 in each of the third and its subsequent stages has a p-channel TFT 1101. The p-channel TFT 1101 of the k-th (k is a natural number equal to or larger than 3, and equal to or less than n) stage is denoted by 1101_k. The electric connection of a gate electrode of the p-channel TFT 1 10l is as shown in FIG. 21; the gate electrode of the p-channel TFT 1101 of one stage receives the output of the first clocked inverter CKINV1 of two stages back from the stage.

With the structure shown in FIG. 21, the shift register can reduce leak current flowing through the p-channel TFTs 501a and 501b of the first clocked inverter. Thus obtained is a shift register which operates at high frequency with less power consumption and which is free from the problems such as noises of power supply lines and a large area for placement.

Figure 22:
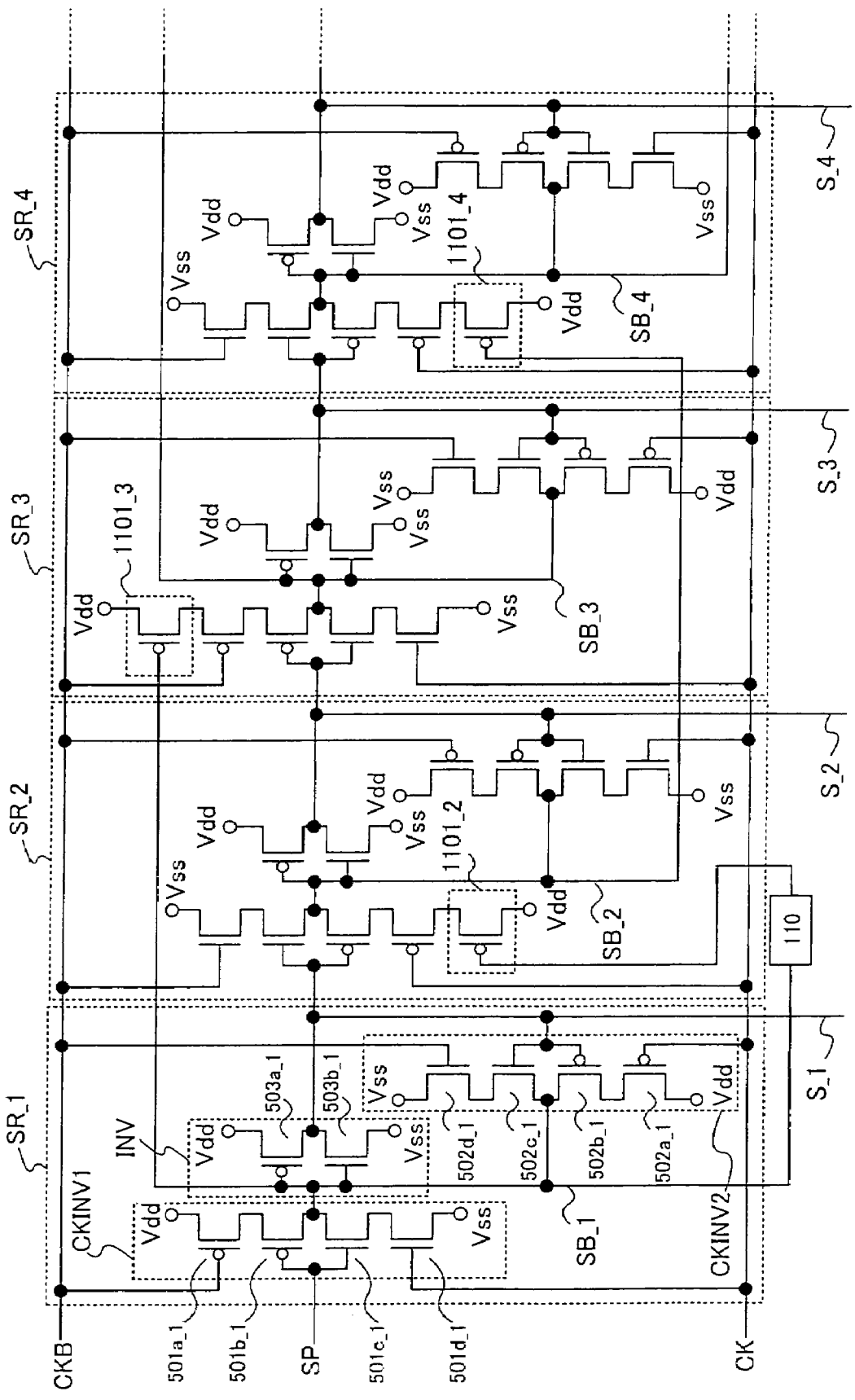
FIG. 22 is a circuit diagram showing the structure of a shift register according to the present invention.

In the structure shown in FIG. 21, another p-channel TFT 1101 may be added to the first clocked inverter CKINV1 of the second stage. This structure is shown in FIG. 22. In the structure shown in FIG. 22, identical components with those in FIG. 21 are denoted by the same reference symbols and explanations thereof are omitted. In FIG. 22, denoted by 110 is a delay circuit. The output of the first clocked inverter CKINV1 of the first stage is inputted to the gate electrode of the added p-channel TFT 1101_2 added to the first clocked inverter CKINV1 of the second stage through the delay circuit 110. The delay circuit 110 delays the signal by about half a cycle of clock pulse.

With the structure shown in FIG. 22, the shift register can reduce the leak current flowing through the p-channel TFTs 501a and 501b of the first clocked inverter. Thus obtained is a shift register which operates at high frequency with less power consumption and which is free from the problems such as noises of power supply lines and a large area for placement.

In the shift registers structured as shown in FIGS. 21 and 22, the p-channel TFT 501a to which a clock pulse CK or an inverted clock pulse CKB is inputted may be removed from the first clocked inverter CKINV1 to which one more p-channel TFT 1101 is added.

Figure 23:
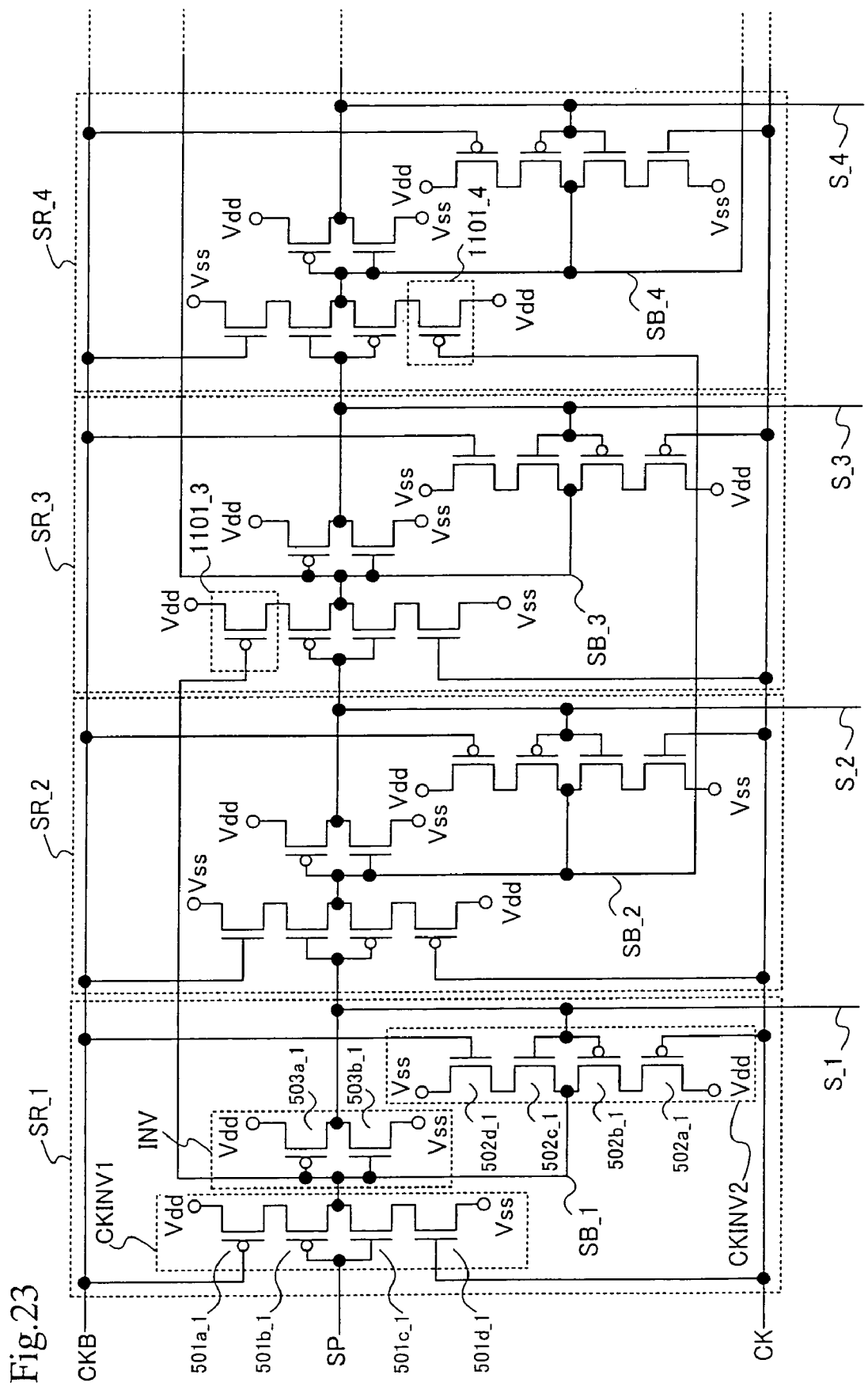
FIG. 23 is a circuit diagram showing the structure of a shift register according to the present invention.

That is, in FIG. 21, the p-channel TFT 501a to which a clock pulse CK or an inverted clock pulse CKB is inputted may be removed from the first clocked inverter CKINV1 in each of the third and its subsequent stages to which one more p-channel TFT 1101 is added. This structure is shown in FIG. 23. For example, the first clocked inverter CKINV1 of the third stage in FIG. 23 does not have the p-channel TFT 501a_3 of FIG. 21.

Figure 24:
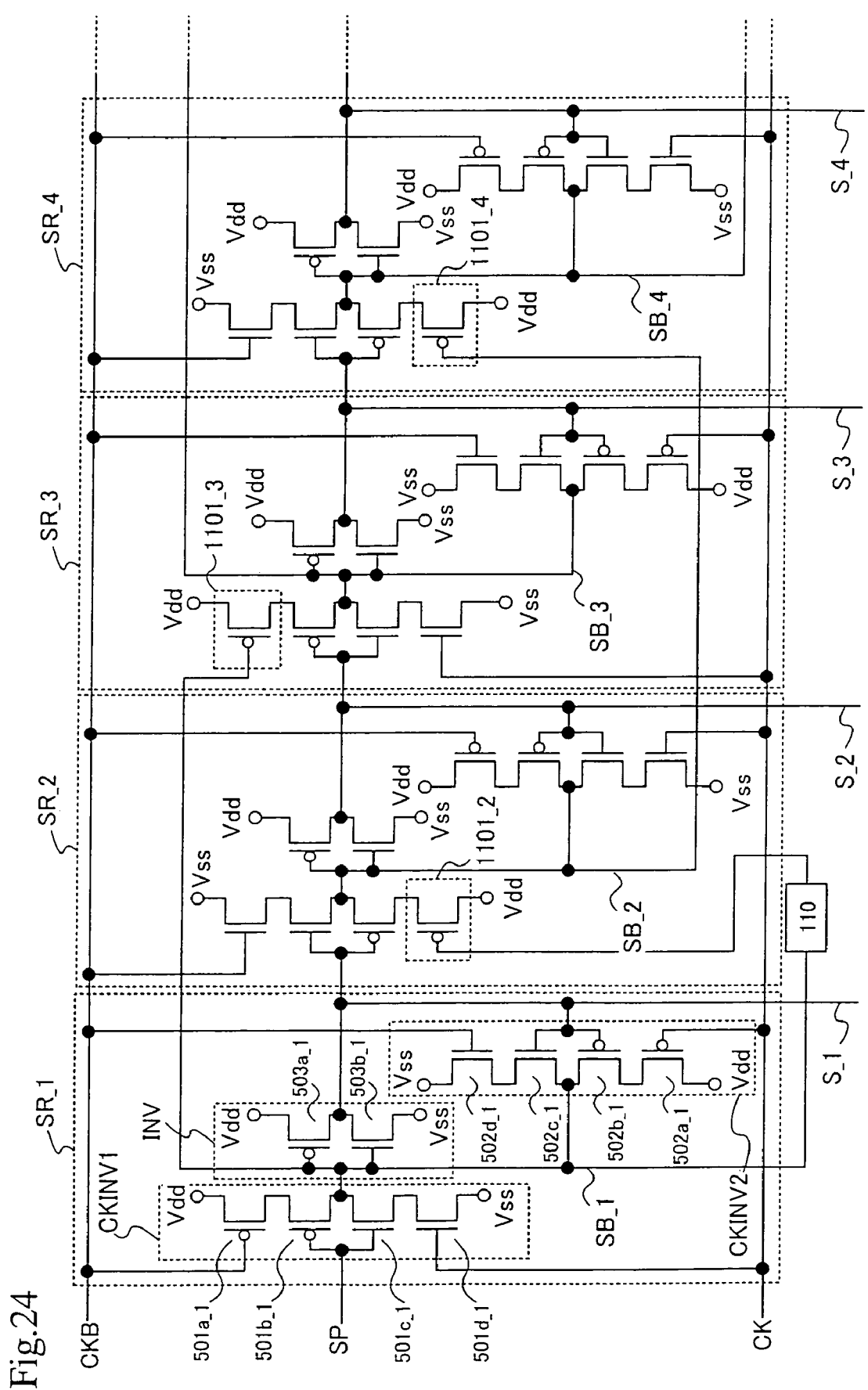
FIG. 24 is a circuit diagram showing the structure of a shift register according to the present invention.

In FIG. 22, the p-channel TFT 501a to which a clock pulse CK or an inverted clock pulse CKB is inputted may be removed from the first clocked inverter CKINV1 in each of the second and its subsequent stages to which one more p-channel TFT 1101 is added. This structure is shown in FIG. 24. For example, the first clocked inverter CKINV1 of the second stage in FIG. 24 does not have the p-channel TFT 501a_2 of FIG. 8.

The structures shown in FIGS. 23 and 24 have the same number of TFTs that constitute the shift register as a conventional shift register has. However, the structures of FIGS. 23 and 24 can reduce fluctuation in output electric potential of the first clocked inverter due to the leak current when the shift register receives a clock pulse and start pulse with a smaller amplitude voltage than the power supply voltage of the shift register. Thus obtained is a shift register which operates at high frequency with less power consumption and which is free from the problems such as noises of power supply lines and a large area for placement.

Figure 25:
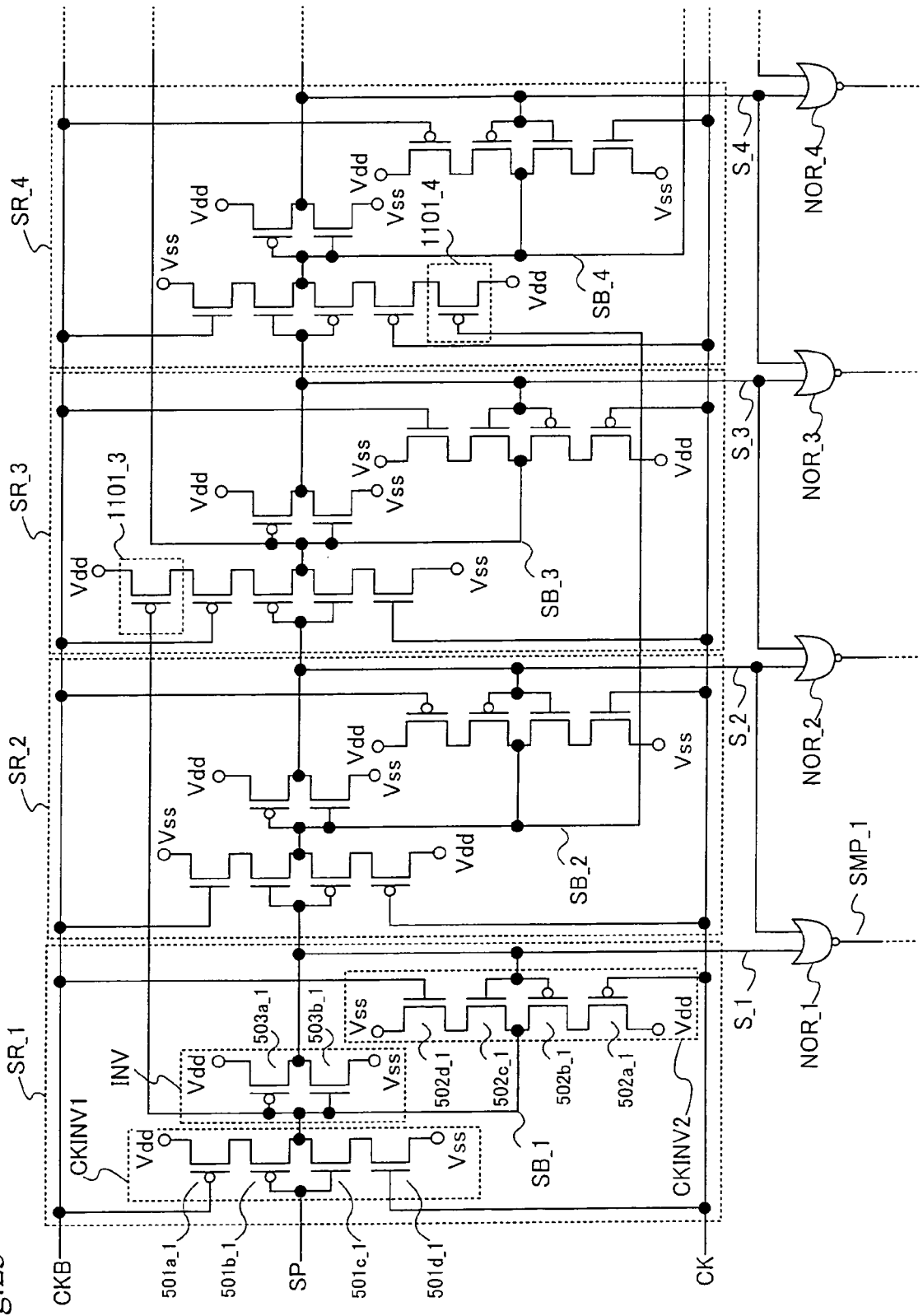
FIG. 25 is a circuit diagram showing the structure of a shift register according to the present invention.

The shift registers of FIGS. 21 to 24 may be modified so that a signal obtained from NOR operation of outputs S of adjacent stages is outputted as an output signal in each stage. FIG. 25 shows a shift register obtained by modifying the shift register of FIG. 21 so that a signal obtained from NOR operation of outputs of adjacent stages is outputted as an output signal.

Note that, in FIG. 25, the fluctuation in output SB_1 of the first clocked inverter CKINV1_1 of the first stage due to the leak current is not a problem if a start pulse SP is inputted in the manner shown in the timing chart in FIG. 21. Although the output SB_2 of the first clocked inverter of the second stage fluctuates due to the leak current, the fluctuation does not interfere with operation of the shift register because the circuit outputs as a sampling pulse SMP_1 a signal obtained from NOR operation of the outputs S_1 and S_2 of the first and second stages. By adding the p-channel TFT 1101 to the first clocked inverter CKINV1 in the third stage and each of its subsequent stages, the leak current is prevented and the shift register can operate normally.

This embodiment may be combined freely with any of Embodiments 1 to 4.

Embodiment 6

A shift register and a driving method thereof according to the present invention can be used in a driving circuit of a display device.

For instance, a driving circuit of an EL (electro luminescence) display device using an EL element and a driving circuit of a liquid crystal display device using a liquid crystal element can employ a shift register and a driving method thereof according to the present invention. By employing the present invention, a highly reliable display device which is small in size and which consumes less power can be provided.

An EL element refers to an element that emits light when a voltage is applied to a pair of electrodes (an anode and a cathode) that sandwiches an EL layer. The EL layer may be formed from an organic compound or an inorganic compound, or from a mixture of an organic compound and inorganic compound. An element including an EL layer that contains an organic compound as its main ingredient is specially called an OLED (organic light emitting diode) element here. A display device using an OLED is called an OLED display device.

An EL layer of the OLED element is referred to as organic compound layer. An organic compound layer usually has a laminate structure. A typical laminate structure thereof is one proposed by Tang et al. of Eastman Kodak Company and consisting of a hole transporting layer, a light emitting layer, and an electron transporting layer. Other examples of the laminate structure include one in which a hole injection layer, a hole transporting layer, a light emitting layer, and an electron transporting layer are layered in order on an anode, and one in which a hole injection layer, a hole transporting layer, a light emitting layer, an electron transporting layer, and an electron injection layer are layered in order on an anode. A light emitting layer may be doped with a fluorescent pigment or the like. The above-mentioned hole injection layer, hole transporting layer, light emitting layer, electron transporting layer, electron injection layer, and other layers are all included in the organic compound layer. A given voltage is applied to an organic compound layer structured as above from a pair of electrodes (an anode and a cathode) to induce recombination of carriers in its light emitting layer. As a result, the light emitting layer emits light.

Layers in an organic compound layer may not be always clearly distinguished from one another, and an organic compound layer may have, between adjacent layers, a layer where the materials of the adjacent layers are mixed.

An OLED element in this specification refers to an element that uses a singlet exciton to emit light (fluorescent light), an element that uses a triplet exciton to emit light (phosphorescent light), or an element that uses the both.

Figure 13:
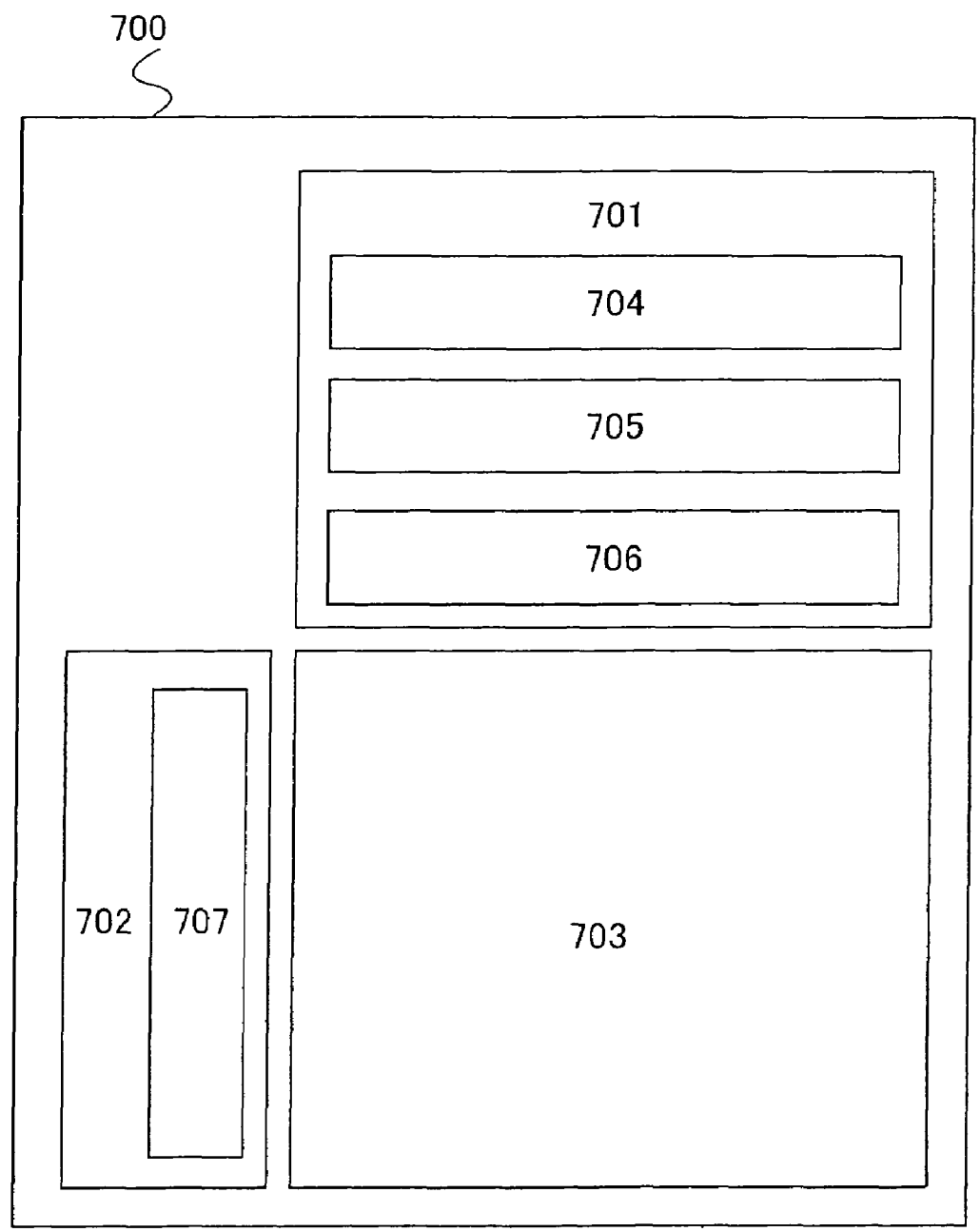
FIG. 13 is a block diagram of a display device having a driving circuit that uses a shift register of the present invention.

FIG. 13 is a block diagram showing an example of the structure of a display device. In FIG. 13, a display device 700 is composed of a source signal line driving circuit 701, a gate signal line driving circuit 702, and a pixel portion 703. The source signal line driving circuit 701 is composed of a shift register 704, a first latch circuit 705, and a second latch circuit 706. The gate signal line driving circuit 702 is composed of a shift register 707.

In the pixel portion 703, a plurality of source signal lines to which signals are inputted from the source signal line driving circuit 701 are arranged to form columns and a plurality of gate signal lines to which signals are inputted from the gate signal line driving circuit 702 are arranged to form rows. A pixel is placed at each of the intersections where the source signal lines and the gate signal lines cross each other.

If the display device 700 is an OLED display device, each pixel has an OLED element. If the display device 700 is a liquid crystal display device, each pixel has a liquid crystal element.

In accordance with a signal from the shift register 707, the gate signal line driving circuit 702 outputs signals sequentially to the gate signal lines to select a pixel row of the pixel portion 703. When a signal is inputted from the shift register 704, the source signal line driving circuit 701 holds video signals sequentially in the first latch circuit 705. The video signals held in the first latch circuit 705 are transferred to the second latch circuit 706 and inputted to the source signal lines. In this way, signals are inputted to one row of pixels. This operation is repeated for all of the pixel rows to display one image.

For example, each pixel of an OLED display device is composed of a switching TFT and an OLED driving TFT. The switching TFT serves as a switch for deciding whether to input a signal of a source signal line to a pixel in accordance with a signal of a gate signal line. The OLED driving TFT controls current flowing into an OLED element of a pixel in accordance with a signal inputted from a source signal line when the switching TFT is turned ON.

Any known pixel structure can be freely employed.

The shift register and the driving method thereof according to the present invention can be used for the shift register 704 of the source signal line driving circuit 701 and in the shift register 707 of the gate signal line driving circuit 702.

This embodiment may be combined freely with any of Embodiments 1 to 5.

Embodiment 7

Figure 15:
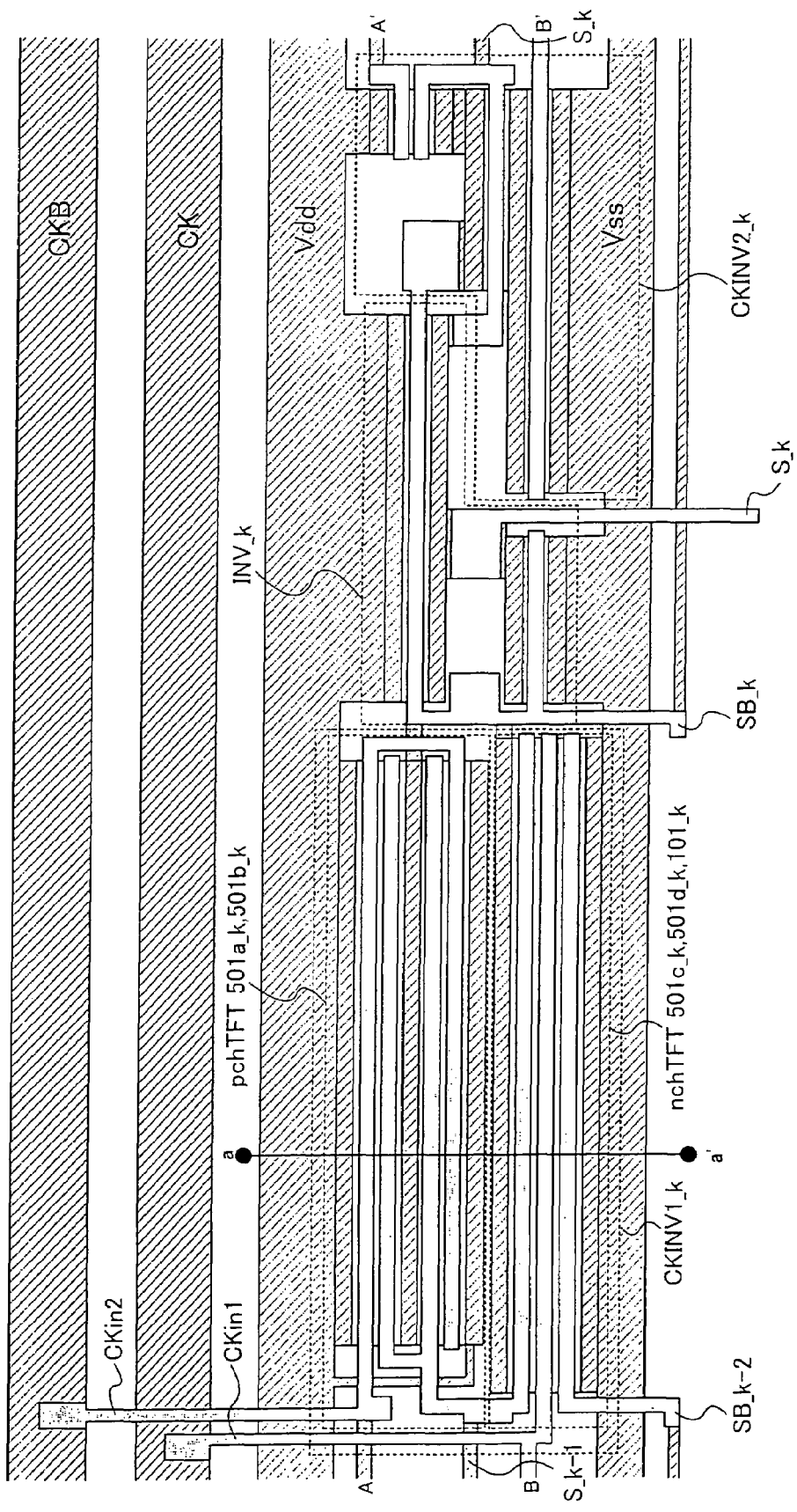
FIG. 15 is a top view showing a manufacture example of a shift register according to the present invention.

This embodiment describes a shift register of the present invention which was actually assembled. A top view thereof is shown in FIG. 15. The top view of FIG. 15 shows a portion which is corresponding to one stage out of the third and its subsequent stages of the shift register in FIG. 1. The top view of FIG. 15 shows as the k-th (k is a natural number equal to or larger than 3) stage SR_k.

The k-th stage SR_k has a first clocked inverter CKINV1_k, a second clocked inverter CKINV2-k, and an inverter INV_k. Components in FIG. 15 that are identical with those in FIG. 1 are denoted by the same reference symbols.

The first clocked inverter CKINV1_k has p-channel TFTs 501a_k and 501b_k. which are denoted by pchTFT 501a_k and pchTFT 501b_k, respectively, in the drawing. The first clocked inverter CKINV1_k also has n-channel TFTs 501c_k, 501d_k and 101_k. which are denoted by nchTFT 501c_k, nchTFT 501d_k, and nchTFT 101_k, respectively, in the drawing. The n-channel TFT 101_k is provided as a countermeasure against leak current.

CK and CKB respectively denote a wiring line to which a clock pulse is inputted and a wiring line to which an inverted clock pulse is inputted. An inverted clock pulse is obtained by inverting the polarity of the clock pulse. Vdd denotes a power supply line to which a high power supply electric potential is inputted. Vss denotes a power supply line to which a low power supply electric potential is inputted.

In the drawing, wiring lines denoted by A and B are connected to A' and B' of the preceding stage (the (k−1)-th stage), respectively. In the circuits of the preceding and following stages (the (k−1)-th stage and the (k+1)-th stage), a wiring line CKin1 for inputting a signal to a gate electrode of the TFT 501d is connected to the wiring line CKB, and a wiring line CKin2 for inputting a signal to a gate electrode of the TFT 501a is connected to the wiring line CK.

A gate electrode of the n-channel TFT 101_k added to the first clocked inverter CKINV1_k of the k-th stage receives a signal SB_k−2 which is corresponding to the output of a first clocked inverter CKINV1_k−2 of the preceding stage (the (k−2)-th stage). (Note that a signal and a terminal or wiring line from which the signal is outputted are denoted by the same reference symbol.) In FIG. 15, SB_k−2 denotes an output terminal of the first clocked inverter of the (k−2)-th stage and an output terminal of the second clocked inverter of the (k−2)-th stage.

Figure 16:
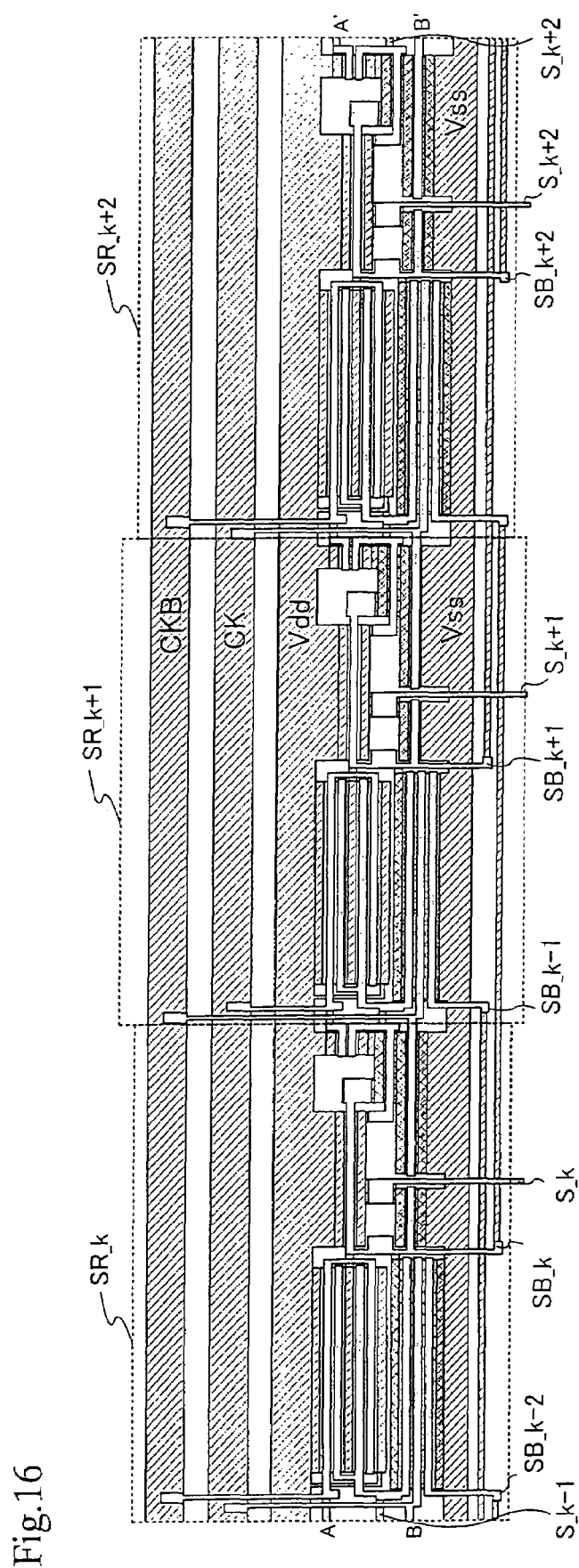
FIG. 16 is a top view showing a manufacture example of a shift register according to the present invention.

FIG. 16 is a top view which shows the structure of three stages of the shift register. Components in FIG. 16 that are identical with those in FIG. 15 are denoted by the same reference symbols and explanations thereof are omitted.

FIG. 16 shows the k-th to the (k+2)-th stages, SR_k to SR_k+2 of the shift register. A gate electrode of an n-channel TFT 101_k+2 of a first clocked inverter CKINV1_k+2 of the (k+2)-th stage SR_k+2 receives a signal SB_k outputted from an output terminal of a first clocked inverter CKINV1_k of the k-th stage SR_k. In FIG. 15, SB_k denotes an output terminal of the first clocked inverter of the k-th stage and an output terminal of the second clocked inverter of the k-th stage.

In the shift registers structured as shown in FIGS. 15 and 16, the n-channel TFT 101 can prevent fluctuation in output electric potential due to the leak current even when inputted pulse signals (a clock pulse, an inverted clock pulse, and a start pulse) have a smaller amplitude voltage than the power supply voltage.

This embodiment may be combined freely with any of Embodiments 1 to 6.

Embodiment 8

This embodiment describes a shift register of the present invention which was actually assembled with referring to a sectional view thereof.

Figure 17:
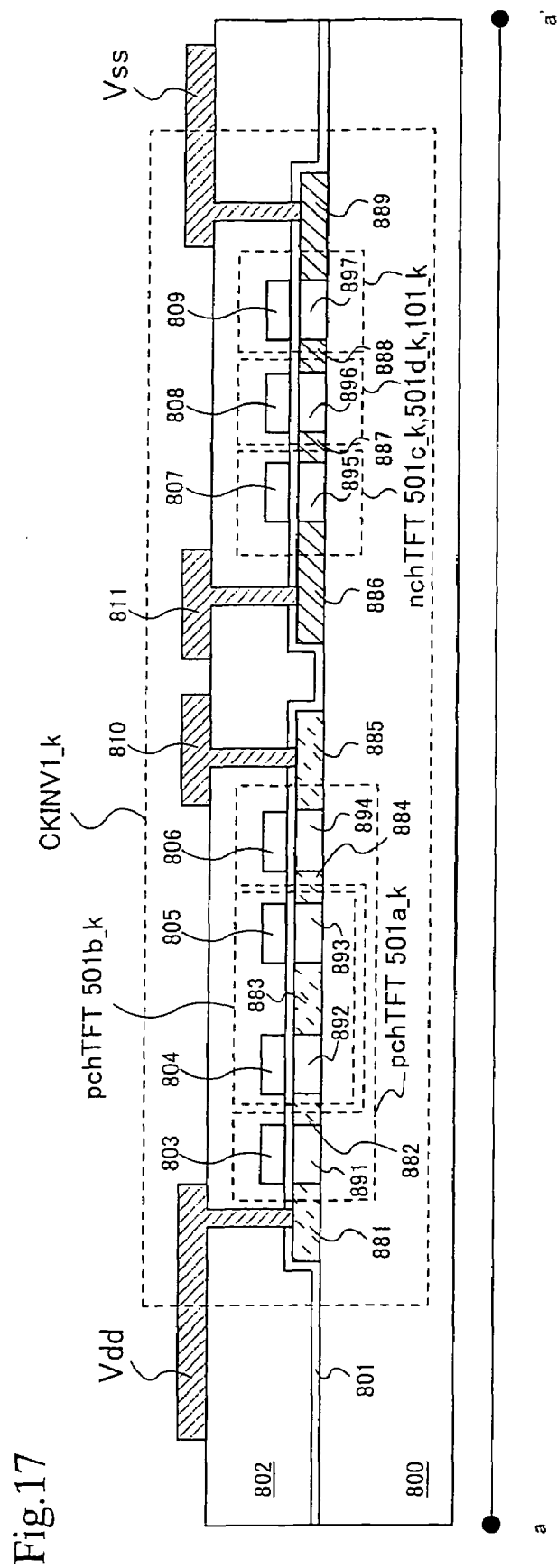
FIG. 17 is a sectional view showing a manufacture example of a shift register according to the present invention.

A sectional view taken along the line a-a' of FIG. 15 is shown in FIG. 17. Components in FIG. 17 that are identical with those in FIG. 15 are denoted by the same reference symbols and explanations thereof are omitted.

P-channel TFTs (pchTFTs in the drawing) 501a_k and 501b_k and n-channel TFTs (nchTFTs in the drawing) 501c_k, 501d_k, and 101_k are formed on a substrate 800 with an insulating surface. Denoted by 801 and 802 are a gate insulating film and an interlayer insulating film, respectively.

The p-channel TFT 501a_k has in its active layer impurity regions 881 and 885 that function as source regions, and regions 891 and 894 that function as channel regions. Impurity regions 882 and 884 function as drain regions. The impurity region 885 is electrically connected to a power supply line Vdd through a wiring line 810. The p-channel TFT 501a_k is a double gate TFT that has gate electrodes 803 and 806 electrically connected in a portion which does not overlap the active layer. The gate electrode 803 is electrically connected to a wiring line CKB through a wiring line CKin2.

The p-channel TFT 501b_k has in its active layer impurity regions 882 and 884 that function as source regions, an impurity region 883 that functions as a drain region, and regions 892 and 893 that function as channel regions. The p-channel TFT 501b_k is a double gate TFT that has gate electrodes 804 and 805 electrically connected in a portion which does not overlap the active layer. The gate electrode 804 is electrically connected to a terminal S_k−1. The impurity region 883 that functions as a drain region is connected to a terminal SB_k.

The drain regions of p-channel TFT 501a_k and the source regions of the p-channel TFT 501b_k are directly connected to each other at the active layers.

The n-channel TFT 501c_k has in its active layer an impurity region 886 that functions as a drain region, an impurity region 887 that functions as a source region, and a region 895 that functions as a channel region. The impurity region 886 that functions as a drain region is connected to the terminal SB_k through a wiring line 811. A gate electrode 807 is connected to the terminal S_k−1.

The n-channel TFT 501d_k has in its active layer an impurity region 887 that functions as a drain region, an impurity region 888 that functions as a source region, and a region 896 that functions as a channel region. A gate electrode 808 is connected to a wiring line CK through a wiring line CKin1.

The n-channel TFT 101_k has in its active layer an impurity region 888 that functions as a drain region, an impurity region 889 that functions as a source region, and a region 897 that functions as a channel region. A gate electrode 809 is connected to a terminal SB_k−2. The impurity region 889 that functions as a source region is electrically connected to a power supply line Vss.

The source region of the n-channel TFT 501c_k and the drain region of the n-channel TFT 501d_k are directly connected to each other at the active layers. The source region of the n-channel TFT 501d_k and the drain region of the n-channel TFT 101_k are directly connected to each other at the active layers.

Given above is a description on a sectional view of a shift register of the present invention which was actually assembled. In the shift register of the present invention, the n-channel TFT 101 can prevent fluctuation in output electric potential due to the leak current even when inputted pulse signals (a clock pulse, an inverted clock pulse, and a start pulse) have a smaller amplitude voltage than the power supply voltage.

This embodiment may be combined freely with any of Embodiments 1 to 7.

Embodiment 9

In this embodiment, an electronic device which utilizes a display device comprising a driving circuit including shift register according to the present invention will be described in FIGS. 14A to 14F.

Figure 14:
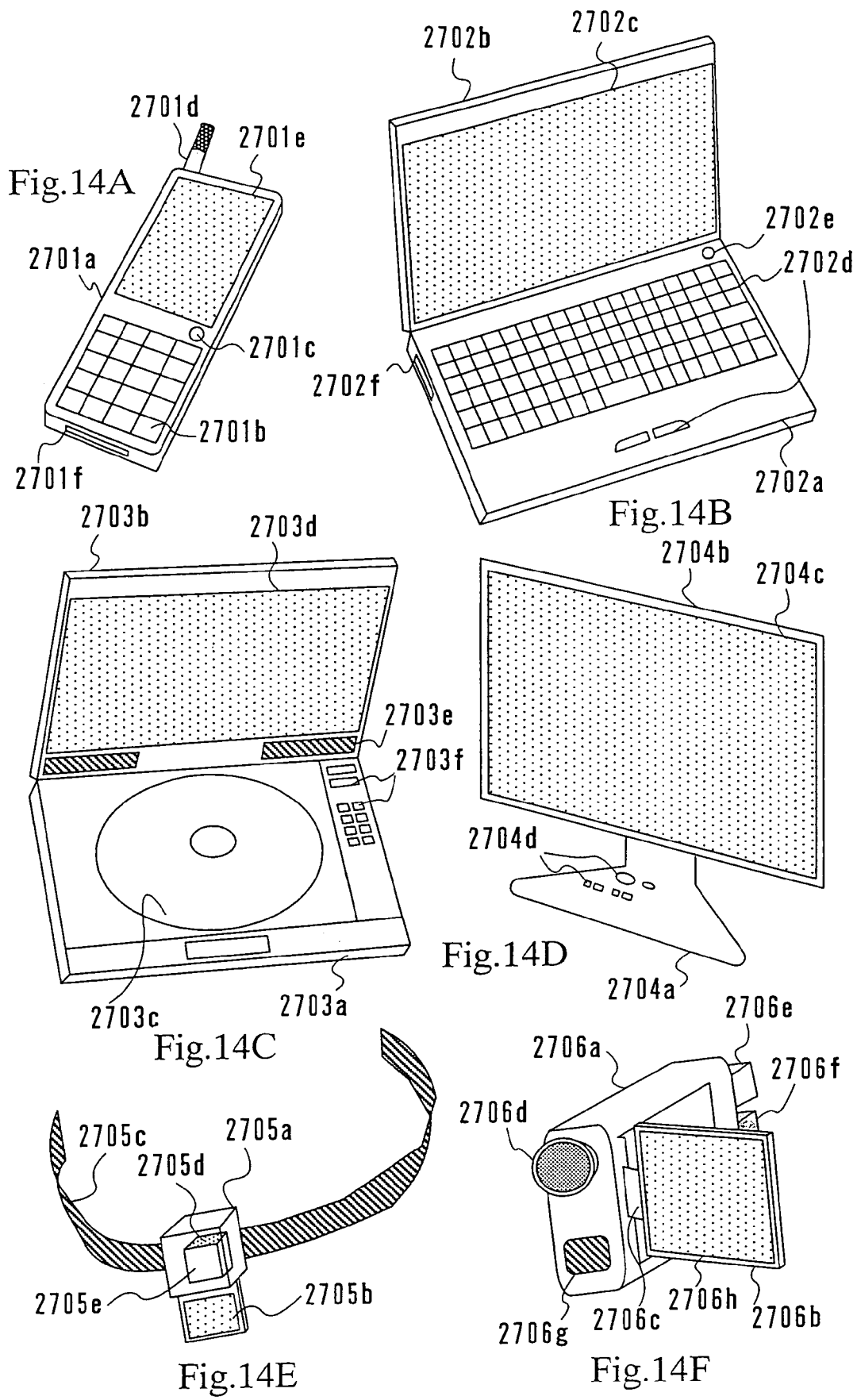
FIGS. 14A to 14F are diagrams showing electronic equipment to which a display device with a driving circuit having a shift register of the present invention is applied.

FIG. 14A is a schematic view of a portable information terminal using the display device of the present invention. The portable information terminal is composed of a main body 2701a, an operational switch 2701b, a power source switch 2701c, an antenna 2701d, a display unit 2701e, and an external input port 2701f. The display device of the present invention can be used for the display unit 2701e.

FIG. 14B is a schematic view of a personal computer using the display device of the present invention. The personal computer is composed of a main body 2702a, a cabinet 2702b, a display unit 2702c, an operational switch 2702d, a power source switch 2702e, and an external input port 2702f. The display device of the present invention can be used for the display unit 2702c.

FIG. 14C a schematic view of an image reproduction device using the display device of the present invention. The image reproduction device is composed of a main body 2703a, a cabinet 2703b, a recording medium 2703c, a display unit 2703d, a voice output unit 2703e, and an operational switch 2703f. The display device of the present invention can be used for the display unit 2703d.

FIG. 14D is a schematic view of a television using the display device of the present invention. The television is composed of a main body 2704a, a cabinet 2704b, a display unit 2704c, and an operational switch 2704d. The display device of the present invention can be used for the display unit 2704c.

FIG. 14E is a schematic view of a head mounted display using the display device of the present invention. The head mounted display is composed of a main body 2705a, a monitor unit 2705b, a head fixing band 2705c, a display unit 2705d, and an optical system 2705e. The display system of the present invention can be used for the display unit 2705d.

FIG. 14F is a schematic view of a video camera using the display device of the present invention. The video camera is composed of a main body 2706a, a cabinet 2706b, a connection unit 2706c, an image receiving unit 2706d, an eyepiece unit 2706e, a battery 2706f, a voice input unit 2706g, and a display unit 2706h. The display device of the present invention can be used for the display unit 2706h.

Applications of the present invention are not limited to the above electronic equipments and may also applied to various other electronic equipments.

This embodiment can be embodied by being freely combined with any of Embodiments 1 to 8.

Embodiment 10

A panel equipped with a conventional shift register and a shift register of the present invention on one substrate is manufactured in this embodiment. In this embodiment, the measurement result of operating above mentioned panel will be described. The input signal voltage is set to 0 to 3 V, and the amplitude of power supply voltage is increased as long as the shift register operates normally. Note that the frequency is set to 5 MHz at this time.

The conventional shift register operated normally in the range of −1.5 V to 5.5 V of the power supply voltage, and the amplitude was 7.0 V. On the other hand, the shift register of the present invention operated normally in the range of −5.0 V to 7.5 V of the power supply voltage, and the amplitude was 12.5 V.

According to the above measurement result, the influence of an irregularity of TFT characteristics can be suppressed since the margin is caused larger when the shift register is used than when the conventional shift register is used. Further, the shift register of the present invention can accurately supply signals to other circuits from the shift register.

Embodiment 11

Figure 27:
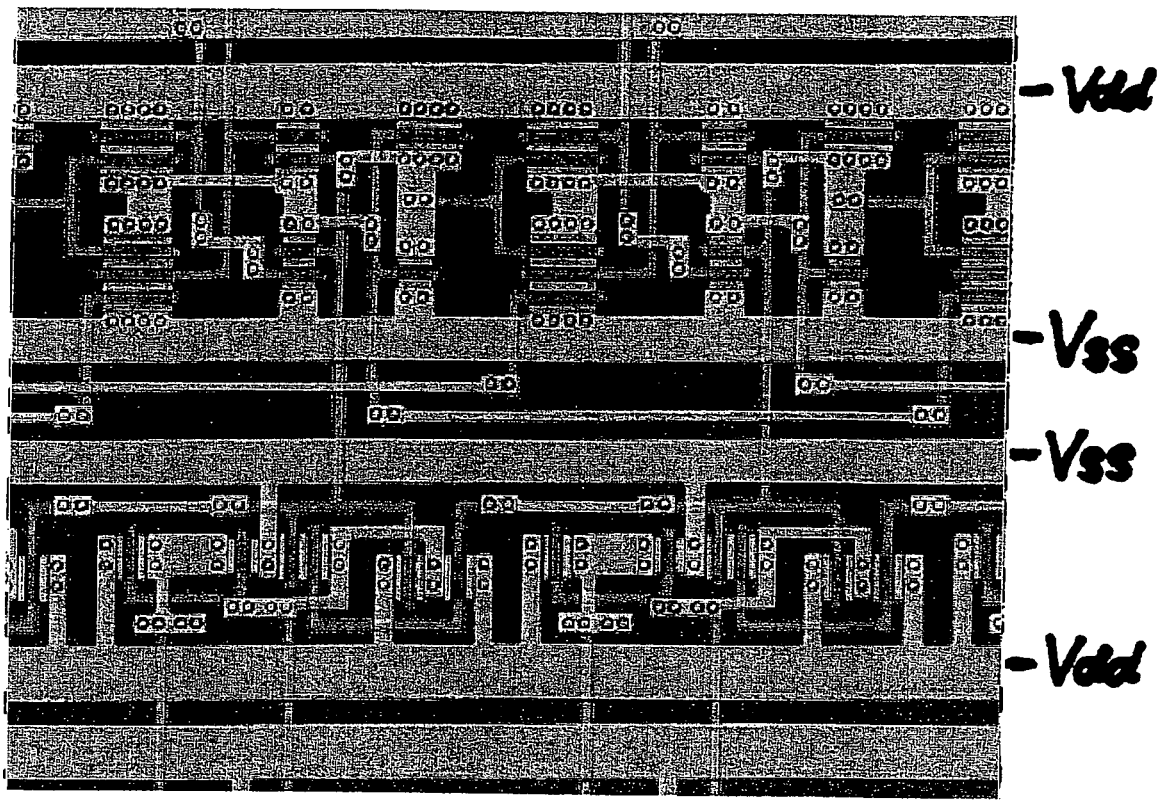
FIG. 27 shows a photograph of the shift register according to the present invention, taken from the upper surface.

The photograph of the shift register according to the present invention, taken from the upper surface, is shown in FIG. 27. The amplitude voltage of input signals is set to 3.0 V and the power supply voltage is set to 8.0 V as a concrete specification.

Figure 28:
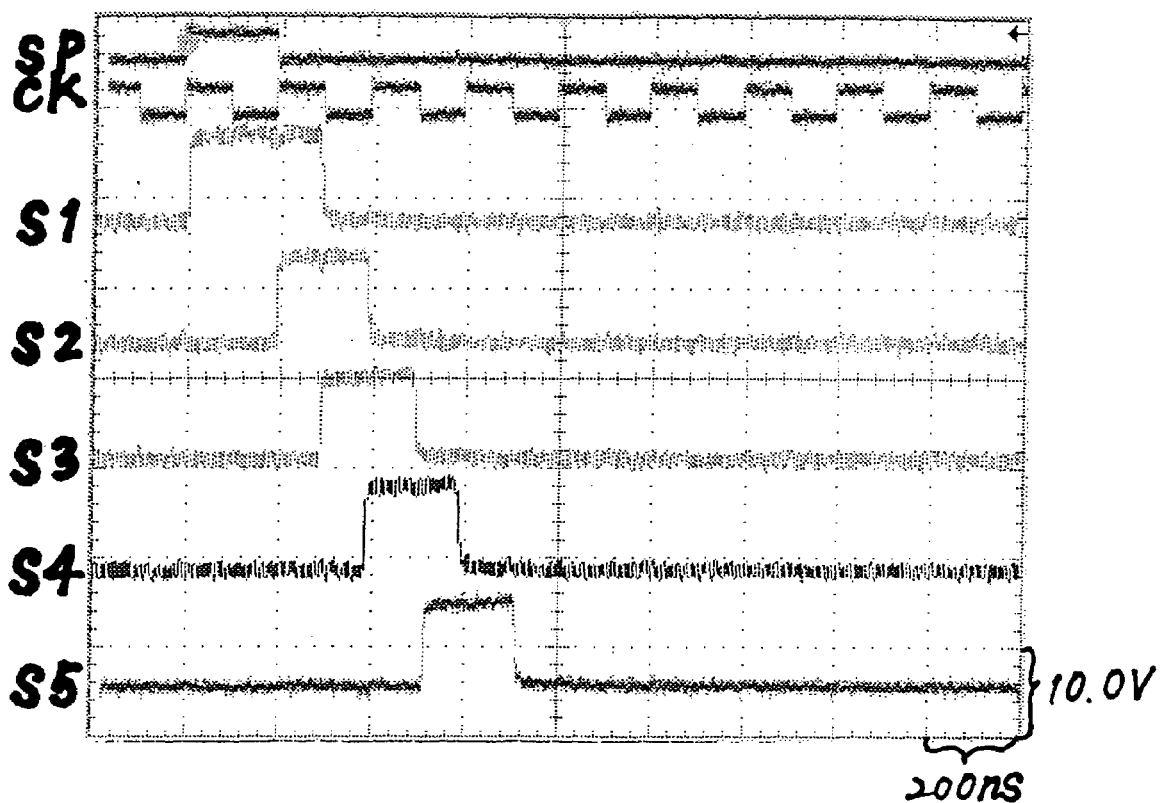
FIG. 28 shows waveforms in operating a shift register according to the present invention at the frequency of 5 MHz.

Moreover, waveforms in operating a shift register according to the present invention at the frequency of 5 MHz is shown in FIG. 28. FIG. 28 shows the waveforms of a start pulse a clock signal, and a signal outputted from the shift register. Note that, although the waveform of the first stage is larger by a half pulse in the signals outputted from the shift register, there is especially no problem since NAND operation is performed with the second stage.

A clock pulse and a start pulse with a smaller amplitude voltage than the power supply voltage of a shift register are inputted to the shift register. There is provided a method of driving a shift register at high frequency with less power consumption, which is free from the problems such as a noise of a power supply line and a large area for placement.

The leak current is reduced by setting gate widths of TFTs that constitute a second clocked inverter wider than prior art in using the above driving method.

Furthermore, another TFT is added to the first clocked inverter. The power supply electric potential is outputted to an output terminal of the first clocked inverter through the source-drain of the added TFT. A signal with an amplitude voltage of about the same level as the power supply voltage of the shift register is inputted to a gate electrode of the added TFT. The added TFT is turned OFF when the leak current causes a problem. In this way, current flowing in the first clocked inverter (leak current) is cut off.

With the above structures, an operation at high frequency with low power supply voltage and reduction in size can be achieved in a shift register.

What is claimed is:

1. A method of driving a shift register that has r (r is a natural number equal to or larger than 3) stages, each of the r stages comprising first and second clocked inverters that each outputs a signal in sync with a clock pulse and an inverted clock pulse obtained by inverting a polarity of the clock pulse, wherein an output terminal of the first clocked inverter is connected to an output terminal of the second clocked inverter, wherein the second clocked inverter receives a signal obtained by inverting the polarity of an output signal of the first clocked inverter, wherein an amplitude voltage of the clock pulse and inverted clock pulse is smaller than a power supply voltage which is corresponding to the electric potential difference between a first power supply electric potential and a second power supply electric potential that are given to the first clocked inverter and second clocked inverter, the method comprising:

in the j-th (j is a natural number equal to or larger than 2 and equal to or smaller than r) stage, giving the first power supply electric potential of the first clocked inverter to the output terminal of the first clocked inverter through a first n-channel TFT and a second n-channel TFT connected in series to the first n-channel TFT;

inputting a signal obtained by inverting the polarity of a signal outputted from the first clocked inverter of the (j−1)-th stage to a gate electrode of the first n-channel TFT, wherein, in the second stage, a gate electrode of the second n-channel TFT receives a signal which is obtained by inverting the polarity of a signal outputted from the first clocked inverter of the first stage and which is delayed, and in the k-th (k is a natural number equal to or larger than 3 and equal to or smaller than r) stage, inputting a signal outputted from the first clocked inverter of the (k−2)-th stage to a gate electrode of the second n-channel TFT.

2. A driving circuit which employs the method of driving a shift register according to claim 1.

3. A display device which includes the driving circuit according to claim 2.

4. An electronic apparatus which employs the display device according to claim 3.

5. An electronic device according to claim 4, wherein the electronic apparatus is one selected from the group consisting of a portable information terminal, a personal computer, an image reproduction device, a television, a head mounted display, and a video camera.

6. A method of driving a shift register that has r (r is a natural number equal to or larger than 3) stages, each of the r stages comprising first and second clocked inverters that each outputs a signal in sync with a clock pulse and an inverted clock pulse obtained by inverting a polarity of the clock pulse,
 wherein an output terminal of the first clocked inverter is connected to an output terminal of the second clocked inverter,
 wherein the second clocked inverter receives a signal obtained by inverting the polarity of an output signal of the first clocked inverter,
 wherein an amplitude voltage of the clock pulse and inverted clock pulse is smaller than a power supply voltage which is corresponding to the electric potential difference between a first power supply electric potential and a second power supply electric potential that are given to the first clocked inverter and second clocked inverter,
 the method comprising:
 in the j-th (j is a natural number equal to or larger than 2and equal to or smaller than r) stage, giving the first power supply electric potential of the first clocked inverter to the output terminal of the first clocked inverter through a first n-channel TFT and a second n-channel TFT connected in series to the first n-channel TFT;
 inputting a signal obtained by inverting the polarity of a signal outputted from the first clocked inverter of the (j−1)-th stage to a gate electrode of the first n-channel TFT,
 wherein, in the second stage, a gate electrode of the second n-channel TFT receives a signal which is obtained by inverting the polarity of a signal outputted from the first clocked inverter of the first stage and which is delayed by about half a cycle of the clock pulse and inverted clock pulse, and
 in the k-th (k is a natural number equal to or larger than 3and equal to or smaller than r) stage, inputting a signal outputted from the first clocked inverter of the (k−2)-th stage to a gate electrode of the second n-channel TFT.

7. A driving circuit which employs the method of driving a shift register according to claim 6.

8. A display device which includes the driving circuit according to claim 7.

9. An electronic apparatus which employs the display device according to claim 8.

10. An electronic device according to claim 9, wherein the electronic apparatus is one selected from the group consisting of a portable information terminal, a personal computer, an image reproduction device, a television, a head mounted display, and a video camera.

11. A method of driving a shift register that has r (r is a natural number equal to or larger than 3) stages, each of the r stages comprising first and second clocked inverters that each outputs a signal in sync with a clock pulse and an inverted clock pulse obtained by inverting a polarity of the clock pulse,
 wherein an output terminal of the first clocked inverter is connected to an output terminal of the second clocked inverter,
 wherein the second clocked inverter receives a signal obtained by inverting the polarity of an output signal of the first clocked inverter,
 wherein an amplitude voltage of the clock pulse and inverted clock pulse is smaller than a power supply voltage which is corresponding to the electric potential difference between a first power supply electric potential and a second power supply electric potential that are given to the first clocked inverter and second clocked inverter,
 the method comprising:
 in the j-th (j is a natural number equal to or larger than 2 and equal to or smaller than r) stage, giving the second power supply electric potential of the first clocked inverter to the output terminal of the first clocked inverter through a first p-channel TFT and a second p-channel TFT connected in series to the first p-channel TFT;
 inputting a signal obtained by inverting the polarity of a signal outputted from the first clocked inverter of the (j−1)-th stage a gate electrode of the first p-channel TFT,
 wherein, in the second stage, a gate electrode of the second p-channel TFT receives a signal which is obtained by inverting the polarity of a signal outputted from the first clocked inverter of the first stage and which is delayed, and
 in the k-th (k is a natural number equal to or larger than 3 and equal to or smaller than r) stage, inputting a signal outputted from the first clocked inverter of the (k−2)-th stage to a gate electrode of the second p-channel TFT.

12. A driving circuit which employs the method of driving a shift register according to claim 11.

13. A display device which includes the driving circuit according to claim 12.

14. An electronic apparatus which employs the display device according to claim 13.

15. An electronic device according to claim 14, wherein the electronic apparatus is one selected from the group consisting of a portable information terminal, a personal computer, an image reproduction device, a television, a head mounted display, and a video camera.

16. A method of driving a shift register that has r (r is a natural number equal to or larger than 3) stages, each of the r stages comprising first and second clocked inverters that each outputs a signal in sync with a clock pulse and an inverted clock pulse obtained by inverting a polarity of the clock pulse,
 wherein an output terminal of the first clocked inverter is connected to an output terminal of the second clocked inverter,
 wherein the second clocked inverter receives a signal obtained by inverting the polarity of an output signal of the first clocked inverter,
 wherein an amplitude voltage of the clock pulse and inverted clock pulse is smaller than a power supply voltage which is corresponding to the electric potential difference between a first power supply electric potential and a second power supply electric potential that are given to the first clocked inverter and second clocked inverter,
 the method comprising:
 in the j-th (j is a natural number equal to or larger than 2 and equal to or smaller than r) stage, giving the second power supply electric potential of the first clocked inverter to the output terminal of the first clocked inverter through a first p-channel TFT and a second p-channel TFT connected in series to the first p-channel TFT;

inputting a signal obtained by inverting the polarity of a signal outputted from the first clocked inverter of the (j−1)-th stage to a gate electrode of the first p-channel TFT, wherein, in the second stage, a gate electrode of the second p-channel TFT receives a signal which is obtained by inverting the polarity of a signal outputted from the first clocked inverter of the first stage and which is delayed by about half a cycle of the clock pulse and inverted clock pulse, and in the k-th (k is a natural number equal to or larger than 3 and equal to or smaller than r) stage, inputting a signal outputted from the first clocked inverter of the (k−2)-th stage to a gate electrode of the second p-channel TFT.

17. A driving circuit which employs the method of driving a shift register according to claim 16.

18. A display device which includes the driving circuit according to claim 17.

19. An electronic apparatus which employs the display device according to claim 18.

20. An electronic device according to claim 19, wherein the electronic apparatus is one selected from the group consisting of a portable information terminal, a personal computer, an image reproduction device, a television, a head mounted display, and a video camera.

* * * * *